US009437766B2

(12) United States Patent
Escher et al.

(10) Patent No.: US 9,437,766 B2
(45) Date of Patent: Sep. 6, 2016

(54) PHOTOVOLTAIC THERMAL HYBRID SYSTEMS AND METHOD OF OPERATION THEREOF

(71) Applicants: International Business Machines Corporation, Armonk, NY (US); Egypt Nanotechnology Center, Giza (EG)

(72) Inventors: Werner Escher, Dusseldorf (DE); Bruno Michel, Rueschlikon (CH); Stephan Paredes, Rueschlikon (CH); Rami Ghannam, Rueschlikon (CH)

(73) Assignees: INTERNATIONAL BUSINESS MACHINES CORPORATION, Armonk, NY (US); EGYPT NANOTECHNOLOGY CENTER (EG)

( * ) Notice: Subject to any disclaimer, the term of this patent is extended or adjusted under 35 U.S.C. 154(b) by 543 days.

(21) Appl. No.: 13/853,431

(22) Filed: Mar. 29, 2013

(65) Prior Publication Data
US 2013/0255753 A1 Oct. 3, 2013

(30) Foreign Application Priority Data
Mar. 30, 2012 (GB) .................. 1205736.0

(51) Int. Cl.
*F24J 2/07* (2006.01)
*F24J 2/10* (2006.01)
(Continued)

(52) U.S. Cl.
CPC ............. *H01L 31/0586* (2013.01); *F24J 2/07* (2013.01); *F24J 2/10* (2013.01); *F24J 2/202* (2013.01);
(Continued)

(58) Field of Classification Search
CPC .......... H01L 31/0586; H01L 31/0547; H01L 31/0521; F24J 2/07; F24J 2/10; F24J 2/202
USPC ................... 136/248; 126/600, 651, 680, 684
See application file for complete search history.

(56) References Cited

U.S. PATENT DOCUMENTS 4,002,031 A * 1/1977 Bell ........................ F03G 6/001
126/698
4,045,246 A 8/1977 Mlavsky et al.
(Continued)

FOREIGN PATENT DOCUMENTS

CN 101175389 A 5/2008
DE 202010005061 U1 8/2010
(Continued)

OTHER PUBLICATIONS

J. Pilchowski, et al., "All Silicon Multi Chip Module with a Fully Integrated Cooling System," International Conference on Multichip Modules and High Density Packaging, 1998, pp. 1-5.
(Continued)

*Primary Examiner* — Jeffrey T Barton
*Assistant Examiner* — Tae-Sik Kang
(74) *Attorney, Agent, or Firm* — Cantor Colburn LLP

(57) ABSTRACT

A method is disclosed for operating a photovoltaic thermal hybrid system having a hybrid solar receiver with a photovoltaic module, operatively coupled to the system to deliver an electrical output power for a power user, a thermal collector distinct from the photovoltaic module, wherein the photovoltaic module and/or the thermal collector are movably mounted in the system, a collector thermal storage thermally connected to the thermal collector to store heat collected at the thermal collector, and a positioning mechanism adapted to move the photovoltaic module and/or the thermal collector. The method includes instructing the positioning mechanism to move the photovoltaic module and/or the thermal collector to change a ratio of an intensity of radiation received at the photovoltaic module to an intensity of radiation received at the thermal collector.

12 Claims, 14 Drawing Sheets

(51) Int. Cl.
*H02S 20/00* (2014.01)
*H01L 31/053* (2014.01)
*H01L 31/052* (2014.01)
*F24J 2/20* (2006.01)
*F24J 2/22* (2006.01)
*H01L 31/042* (2014.01)
*H02S 40/44* (2014.01)
*H01L 31/054* (2014.01)
*H02S 10/20* (2014.01)
*F24J 2/00* (2014.01)

(52) U.S. Cl.
CPC ............... *F24J 2/22* (2013.01); *H01L 31/0521* (2013.01); *H01L 31/0547* (2014.12); *H02S 10/20* (2014.12); *H02S 20/00* (2013.01); *H02S 40/44* (2014.12); *F24J 2002/0092* (2013.01); *Y02E 10/41* (2013.01); *Y02E 10/44* (2013.01); *Y02E 10/52* (2013.01); *Y02E 10/60* (2013.01)

(56) References Cited

U.S. PATENT DOCUMENTS

| | | | |
|---|---|---|---|
| 4,119,087 A * | 10/1978 | Cook | F24D 19/1057 126/588 |
| 4,122,831 A * | 10/1978 | Mahdjuri | F24J 2/055 126/657 |
| 4,169,738 A | 10/1979 | Luque | |
| 4,211,581 A | 7/1980 | Vasilinina et al. | |
| 4,419,532 A | 12/1983 | Severns | |
| 4,700,013 A | 10/1987 | Soule | |
| 4,719,903 A | 1/1988 | Powell | |
| 4,830,678 A | 5/1989 | Todorof et al. | |
| 5,269,851 A | 12/1993 | Horne | |
| 5,344,496 A | 9/1994 | Stern et al. | |
| 5,374,317 A | 12/1994 | Lamb et al. | |
| 5,388,635 A | 2/1995 | Gruber et al. | |
| 5,522,944 A * | 6/1996 | Elazari | F24D 11/003 126/585 |
| 5,529,054 A | 6/1996 | Shoen | |
| 6,080,927 A | 6/2000 | Johnson | |
| 6,219,236 B1 | 4/2001 | Hirano et al. | |
| 6,472,804 B2 | 10/2002 | Mueller et al. | |
| 6,531,653 B1 | 3/2003 | Glenn et al. | |
| 6,688,303 B2 | 2/2004 | Davenport et al. | |
| 6,798,464 B2 | 9/2004 | Bietsch et al. | |
| 2002/0005272 A1 | 1/2002 | Hirano et al. | |
| 2005/0211418 A1 | 9/2005 | Kenny et al. | |
| 2007/0119565 A1 | 5/2007 | Brunschwiler et al. | |
| 2007/0289622 A1 | 12/2007 | Hecht | |
| 2008/0041441 A1 * | 2/2008 | Schwartzman | G02B 5/001 136/246 |
| 2011/0017199 A1 | 1/2011 | Hernandez | |
| 2011/0073161 A1 * | 3/2011 | Scanlon | F24J 2/38 136/246 |

FOREIGN PATENT DOCUMENTS

| | | | | |
|---|---|---|---|---|
| DE | 102010019158 A1 | 11/2011 | | |
| FR | 2926676 A1 | 7/2009 | | |
| IL | WO 2008114247 A1 * | 9/2008 | | F24J 2/0444 |
| WO | 9313556 A1 | 7/1993 | | |
| WO | 2009144700 A1 | 12/2009 | | |
| WO | 2010078473 A2 | 7/2010 | | |
| WO | 2010117874 A2 | 10/2010 | | |
| WO | 2011096801 A2 | 8/2011 | | |

OTHER PUBLICATIONS

Gur Mittelman, et al."Solar Cooling With Concentrating Photovoltaic/thermal (CPVT) Systems," Elsevier, Engergy and Conversion Management, 48, 2007, pp. 2481-2490.

P.W. Ruch, et al., "Recycling Thermal Energy Boosts Efficiencies in Datacenters and Concentrated Photovoltaic Systems," IBM, Smart Energy Strategies Conference ETH Zurich, 2011, pp. 1-24.

P.W. Ruch, et al., "Building a smarter Energy Future," Smart Energy Day, IBM, 2010, pp. 1-30.

Haruhiko Yamamoto, "Multichip Module Packaging for Cryogenic Computers," IEEE International Symposium on Circuits and Systems, vol. 4, pp. 2296-2299, 1991.

UK Intellectual Property Office, Search Report under Section 17(5); Application No. GB1205732.9; Mailed: Sep. 6, 2012; pp. 1-3.

UK Intellectual Property Office, Search Report under Section 17(5); Application No. GB1205738.6; Mailed: Sep. 12, 2012; pp. 1-3.

UK Intellectual Property Office, Search Report under Section 17(5); Application No. GB1205736.0; Mailed: Sep. 11, 2012; pp. 1-3.

PCT International Search Report and Written Opinion; International Application No. PCT/IB2013/051851; International Filing Date: Mar. 8, 2013; Date of Mailing: Sep. 5, 2013; pp. 1-12.

PCT International Search Report and Written Opinion; International Application No. PCT/IB2013/051850; International Filing Date: Mar. 8, 2013; Date of Mailing: Nov. 4, 2013; pp. 1-12.

PCT International Search Report and Written Opinion; International Application No. PCT/IB2013/051852; International Filing Date: Mar. 8, 2013; Date of Mailing: Nov. 4, 2013; pp. 1-11.

* cited by examiner

PHOTOVOLTAIC THERMAL HYBRID SYSTEMS AND METHOD OF OPERATION THEREOF

PRIORITY

This application claims priority to Great Britain Patent Application No. 1205736.0, filed Mar. 30, 2012, and all the benefits accruing therefrom under 35 U.S.C. §119, the contents of which in its entirety are herein incorporated by reference.

BACKGROUND

The present invention generally relates to photovoltaic thermal hybrid solar systems and methods of operation thereof.

Definitions of certain terms discussed herein are as follows:

Photovoltaics (PV) generate electrical power by converting solar radiation into direct current electricity through semiconductors exhibiting the photovoltaic effect;

A photovoltaic cell (or PV cell, also "solar cell" or "photoelectric cell") is a solid state device that converts energy of light directly into electricity by virtue if the photovoltaic effect;

A photovoltaic module (also "solar module", "solar panel" or "photovoltaic panel") is an assembly of connected photovoltaic cells;

A photovoltaic system typically includes an array of photovoltaic modules, an inverter and interconnection wiring;

A thermal collector (also "solar thermal collector") collects heat by absorbing radiations, such as sunlight;

A heat exchanger is a device/piece of equipment to efficiently transfer heat from one medium to another;

In electronic systems, a heat sink is a component to cool a device by dissipating heat into a surrounding medium;

Solar thermal energy (STE) concerns technologies for harnessing solar energy for thermal energy (heat). STE differs from and is acknowledged to be much more efficient than photovoltaics, which converts solar energy directly into electricity;

Concentrated solar power (also "concentrating solar power" or CSP) systems use mirrors or lenses that concentrate a large area of solar thermal energy onto a small area, such that electrical power (also "power") can be produced when concentrated light is converted to heat, which drives a heat engine (e.g., a steam turbine) connected to a power generator. Common forms of concentration are: parabolic trough, dish Stirlings, concentrating linear Fresnel reflector and solar power tower.

Concentrated photovoltaic (CPV) systems use optics (e.g., lenses) to concentrate a large amount of sunlight onto a small area of solar photovoltaic materials to generate electricity. Concentration allows for production of smaller areas of solar cells.

CPV should not to be confused with CSP: in CSP concentrated sunlight is converted to heat, and then heat is converted to electricity, whereas in CPV concentrated sunlight is converted directly to electricity using the photovoltaic effect;

Photovoltaic thermal hybrid solar collectors (also "hybrid PV/T systems" or PVT) are systems converting solar radiation into thermal and electrical energy. Such systems combine a photovoltaic cell, which converts photons into electricity, with a solar thermal collector, which captures the remaining energy and removes waste heat from the PV module. Two categories of PVT collectors are generally known:

PV/T fluid collector (air or liquid). In liquid collectors, a typical water-cooled design uses conductive-metal piping or plates attached to the back of a PV module. The working fluid is typically water or glycol. The heat from the PV cells are conducted through the metal and absorbed by the working fluid, which assumes that the working fluid is cooler than the operating temperature of the cells. In closed-loop systems this heat is either exhausted (to cool it) or transferred at a heat exchanger, where it flows to its application. In open-loop systems, this heat is used, or exhausted before the fluid returns to the PV cells;

PV/T concentrator (CPVT), wherein a concentrating system is provided to reduce the amount of solar cells needed. CPVT can reach very good solar thermal performance compared to flat PV/T collectors. However, main obstacles to CPVT are to provide good cooling of the solar cells and a durable tracking system.

A disadvantage of PV systems compared to other energy sources is the unpredictable nature of the direct solar radiation. This leads to intermittent power delivery, which has much less value than on demand power and leads to grid instabilities. Storage of electrical energy in e.g. batteries is prohibitively expensive so that the cost for a storage unit for a full day production costs much more than the solar power station. Concentrated solar power systems (CSP) that can store the collected heat can produce electricity on demand until the stored heat is dissipated. Concentrated photovoltaic (CPV) power plants have higher conversion efficiencies than PV and CSP but still suffer from intermittent power production. Concentrated photovoltaic thermal (CPVT) systems have a higher system efficiency because of the improved cooling but reject the heat to the ambient or produce low grade heat with limited utility.

SUMMARY

In one embodiment, a method is disclosed for operating a photovoltaic thermal hybrid system having a hybrid solar receiver with a photovoltaic module, operatively coupled to the system to deliver an electrical output power for a power user, a thermal collector distinct from the photovoltaic module, wherein the photovoltaic module and/or the thermal collector are movably mounted in the system, a collector thermal storage thermally connected to the thermal collector to store heat collected at the thermal collector, and a positioning mechanism adapted to move the photovoltaic module and/or the thermal collector. The method includes instructing the positioning mechanism to move the photovoltaic module and/or the thermal collector to change a ratio of an intensity of radiation received at the photovoltaic module to an intensity of radiation received at the thermal collector.

In another embodiment, a photovoltaic thermal hybrid system includes a hybrid solar receiver, having a photovoltaic module designed for electrical output power delivery; a thermal collector distinct from the photovoltaic module, wherein the photovoltaic module and/or the thermal collector are movably mounted in the system; a collector thermal storage thermally connected to the thermal collector to store heat collected at the thermal collector; a positioning mechanism adapted to move the photovoltaic module and/or the thermal collector; and a control unit configured to instruct the positioning mechanism to move the photovoltaic module and/or the collector to change a ratio of an intensity of radiation received at the photovoltaic module to an intensity of radiation received at the thermal collector.

DETAILED DESCRIPTION

Figure 1:
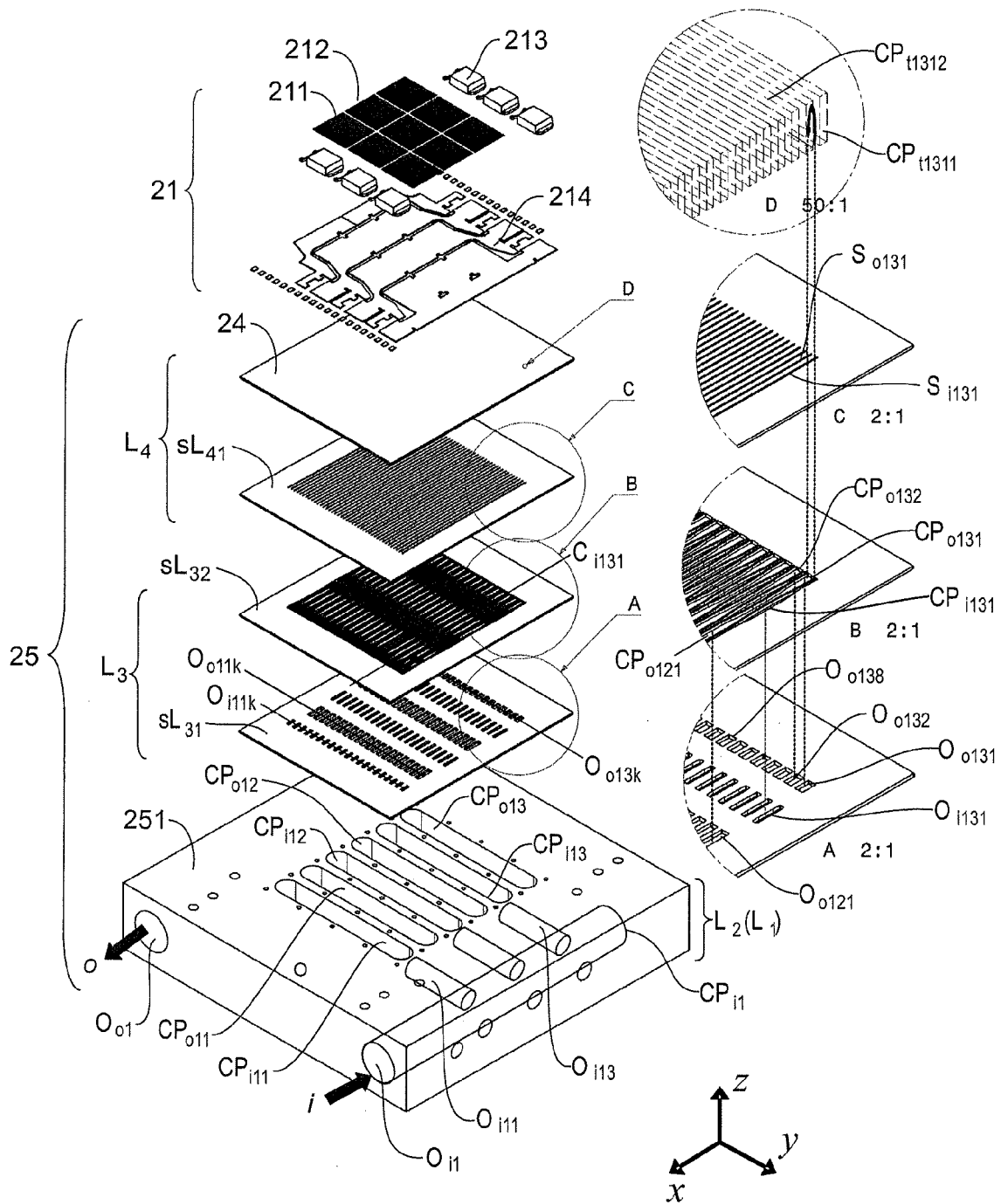
FIG. 1 shows an exploded 3D view of a multilayer cooling device for a photovoltaic device.

According to a first aspect, a method of operating a photovoltaic thermal hybrid system is disclosed, the latter comprising a hybrid solar receiver, having a photovoltaic module, operatively coupled to the system to deliver an electrical output power for a power user; and a thermal collector distinct from the photovoltaic module, wherein the photovoltaic module and/or the thermal collector are movably mounted in the system; and a collector thermal storage thermally connected to the thermal collector to store heat collected at the thermal collector; and positioning mechanism adapted to move the photovoltaic module and/or the thermal collector. The method includes: instructing the positioning mechanism to move the photovoltaic module and/or the thermal collector to change a ratio of an intensity of radiation received at the photovoltaic module to an intensity of radiation received at the thermal collector.

Embodiments of the invention may include one or more of the following features: the method further includes receiving data indicative of an electrical power demand; and instructing the positioning mechanism is carried out based on a comparison of the output power with the power demand; instructing the positioning mechanism includes instructing the positioning mechanism to move the photovoltaic module and/or the thermal collector to decrease the ratio if the comparison indicates that the output power is larger than the power demand; the method further includes instructing to deliver an output power generated by the photovoltaic module to a power user, to meet the power demand if the output power matches the power demand. The system further includes a heat engine, thermally connected to the collector thermal storage, the method further comprising instructing the heat engine to start a process of thermal-to-electrical conversion of heat stored in the collector thermal storage if an output power generated by the photovoltaic device is lower than the power demand. The method further includes: instructing to trigger a desalination process and/or an adsorption cooling process, in order to dissipate heat from the collector thermal storage. The system further includes: a first heat circuit connecting the photovoltaic module to a photovoltaic thermal storage distinct from the collector thermal storage, to cool the photovoltaic module; and a second heat circuit, distinct from the first heat circuit, and connecting the collector thermal storage to the thermal collector.

The system further includes a heat exchanger, thermally connected to the photovoltaic thermal storage, and the method further includes instructing to provide heat stored in the photovoltaic thermal storage to a thermal user via the heat exchanger; in the system, the heat exchanger is further thermally connected to the collector thermal storage, the method further comprising instructing to provide additional heat stored in the collector thermal storage to the heat exchanger while providing heat stored in the photovoltaic thermal storage to the thermal user via the heat exchanger. The system further includes an additional heat exchanger thermally connected to the heat engine and a given thermal user, the given thermal user being further thermally connected to the photovoltaic thermal storage or to both the photovoltaic thermal storage and the collector thermal storage, via the heat exchanger, and the method further includes instructing the heat engine to start a process of thermal-to-electrical conversion of heat stored in the collector thermal storage using the given thermal user as a low temperature pool. In the system, a temperature in the collector thermal storage is substantially larger than a temperature in the photovoltaic thermal storage, preferably by more than 30° C., more preferably by more than 50° C.; in the system, the photovoltaic thermal hybrid solar receiver is movably mounted in the system, such that the positioning mechanism can move the photovoltaic thermal hybrid solar receiver as a whole;

In the system, the thermal collector extends in a first plane and includes an aperture; and the photovoltaic module includes a photo-active area within an area of the photovoltaic module that extends in a second plane, at a distance of the aperture, the photo-active area being vis-à-vis the aperture, a projection of the aperture perpendicularly to the second plane essentially corresponding to the photo-active area, and the thermal collector further preferably includes one of or both the following components: one or more mirror elements provided in an intermediate section between the first plane and the second plane, the mirror elements preferably thermally connected to the collector thermal storage, by a same heat circuit that connects the thermal collector to the collector thermal storage; and a band pass filter arranged at the level of the aperture;

The system further includes a concentrator, arranged to concentrate radiation towards an optical focus thereof, and the positioning mechanism is adapted to move the photovoltaic module in or out of the optical focus.

According to another aspect, the invention is embodied as a photovoltaic thermal hybrid system, comprising: (i) an hybrid solar receiver, having a photovoltaic module designed for electrical output power delivery and a thermal collector distinct from the photovoltaic module, wherein the photovoltaic module and/or the thermal collector are movably mounted in the system; (ii) a collector thermal storage thermally connected to the thermal collector to store heat collected at the thermal collector; and (iii) positioning mechanism adapted to move the photovoltaic module and/or the thermal collector; and further comprising (iv) a control unit configured to instruct the positioning mechanism to move the photovoltaic module and/or the collector to change a ratio of an intensity of radiation received at the photovoltaic module to an intensity of radiation received at the thermal collector, e.g., based on a comparison of the output power with a power demand as received at the control unit.

Devices, systems, methods of operating such devices and systems, as well as computer program functions partly implementing embodiments of the present invention will now be described, by way of non-limiting examples, and in reference to the accompanying drawings.

The present invention forms part of comprehensive CPVT solutions. Such solutions revolve around novel photovoltaic thermal hybrid receivers. Aspects of these solutions concern such receivers, cooling devices for such receivers, photovoltaic thermal hybrid systems and operation methods.

The present invention proposes novel systems and methods for operating a photovoltaic thermal hybrid system. Such systems and methods rely on a hybrid solar receiver, equipped with a photovoltaic (or PV) module capable of delivering an electrical output power, and a thermal collector distinct from the PV module. The PV module and/or the thermal collector are movably mounted in the system. Furthermore, a collector thermal storage is (thermally) connected to the thermal collector, in order to store heat collected at the latter. In addition, positioning mechanism are provided, which are adapted to move the PV module and/or the thermal collector. Then, instructing the positioning mechanism to move the PV module and/or the thermal collector results in changing the ratio of the intensity of radiation received at the PV module to the intensity received at the thermal collector. Thus, excess radiation received at the PV module (i.e., larger than necessary to meet a power demand) can advantageously be used to heat up the thermal circuit and store heat at the thermal storage.

Figure 2:
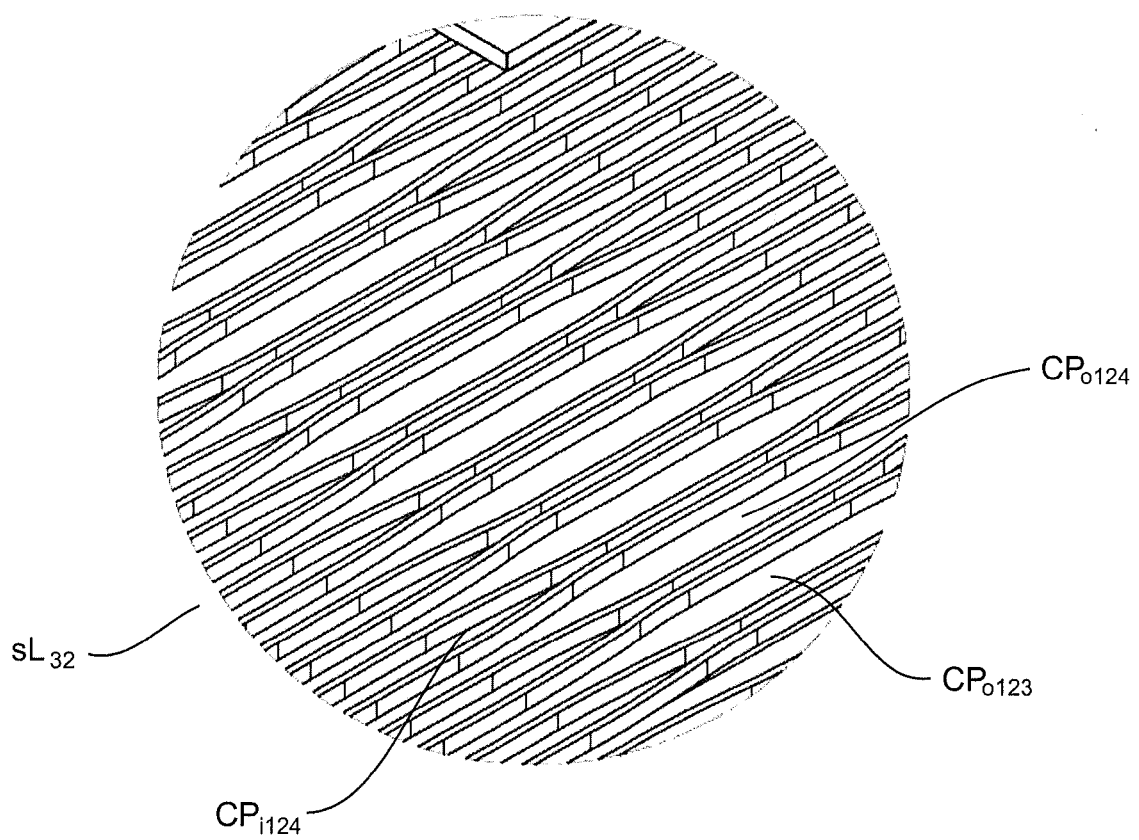
FIG. 2 focuses on a specific channel portion pattern, designed for a given layer of the device of FIG. 1.
Figure 3:
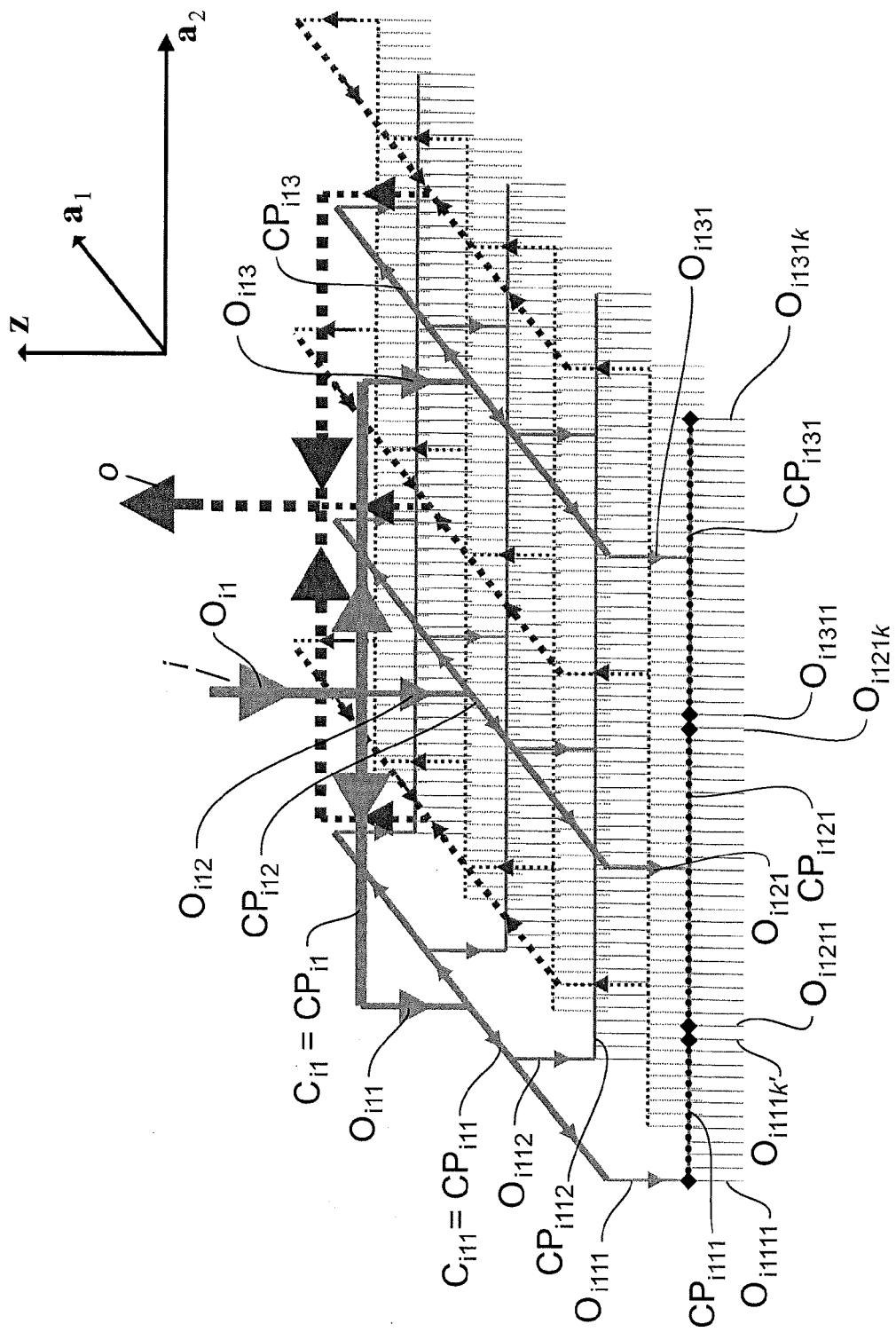
FIG. 3 depicts a 3D tree structure representing an arrangement of orifices and channel portions of a cooling device.
Figure 4:
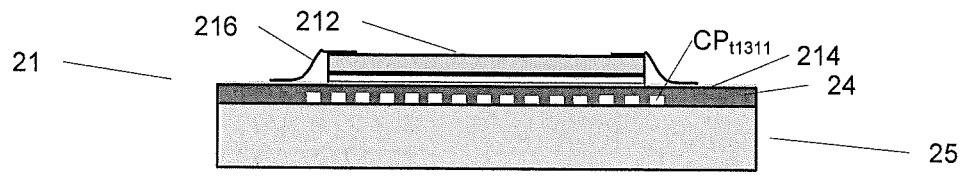
FIG. 4 shows a side view of a photovoltaic device mounted on a cooling device.
Figure 5:
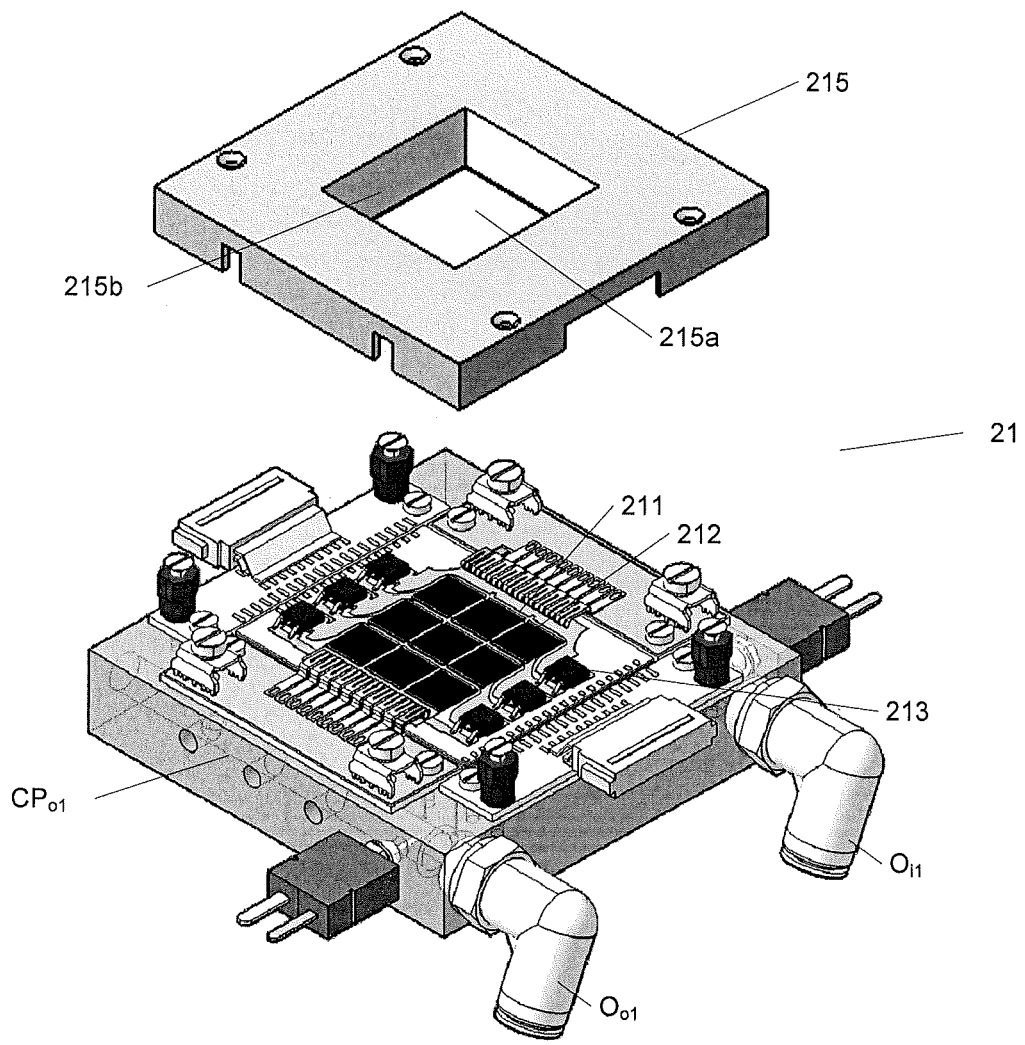
FIG. 5 is a 3D view of such a photovoltaic device, mounted on a cooling device.
Figure 6:
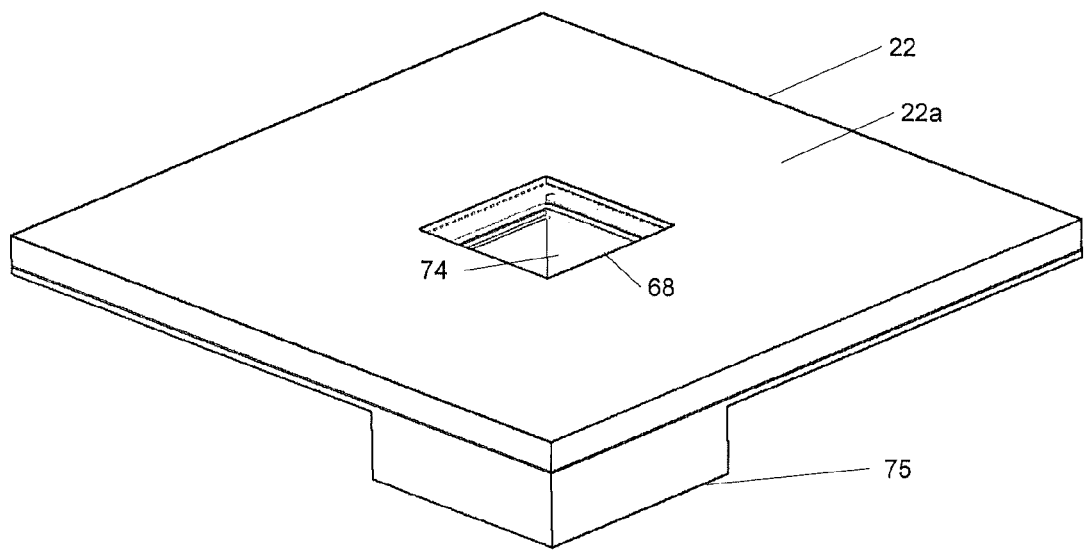
FIG. 6 is a 3D view of a thermal collector for a photovoltaic device.
Figure 7:
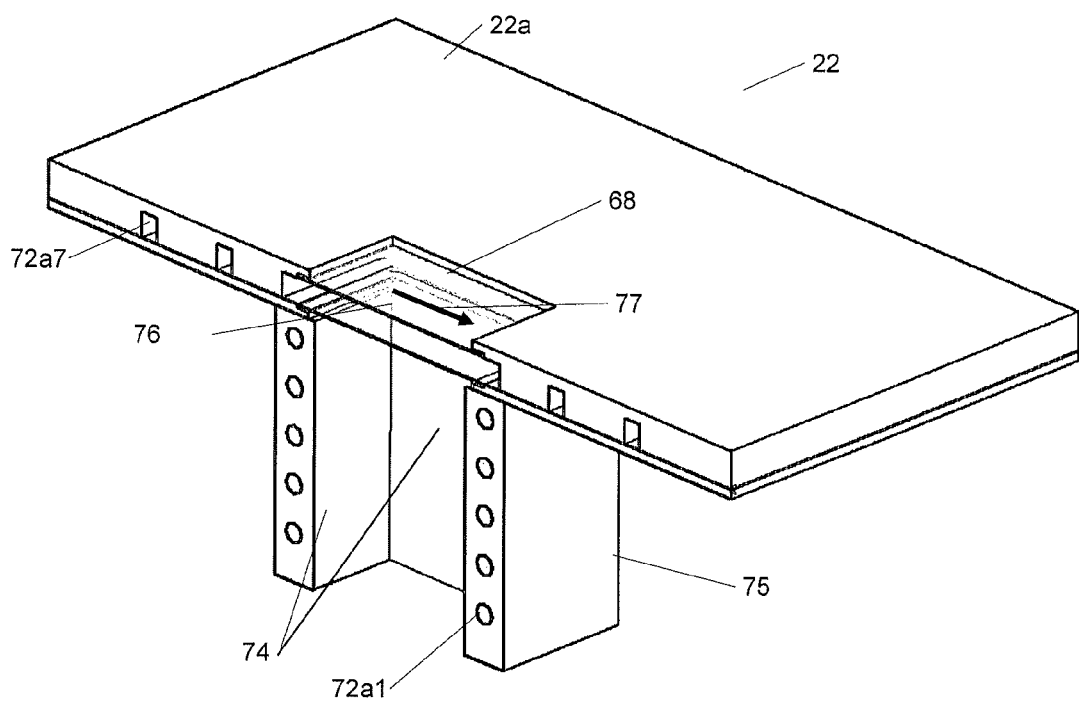
FIG. 7 is a partial view of FIG. 6, showing a section of the thermal collector.
Figure 8:
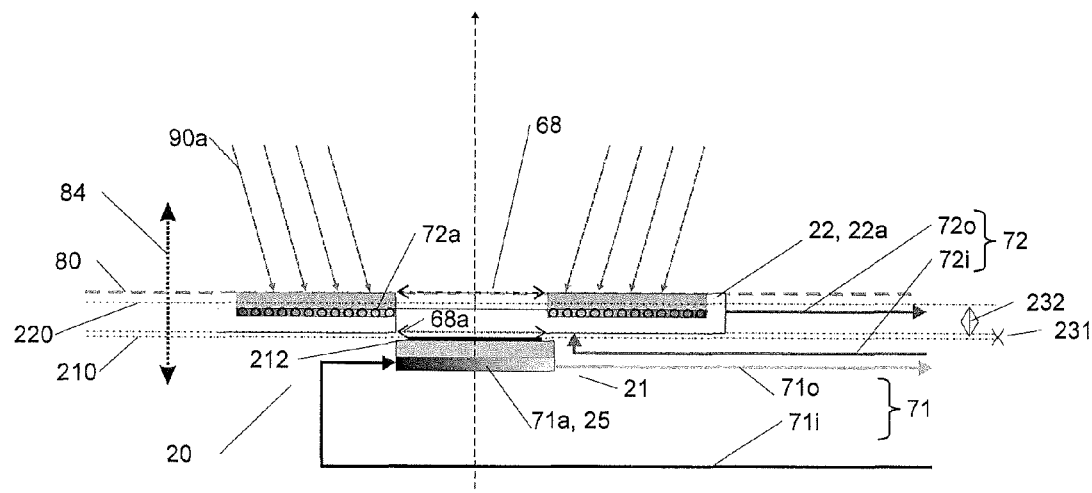
FIG. 8 is a section view of a photovoltaic thermal hybrid solar receiver.
Figure 9:
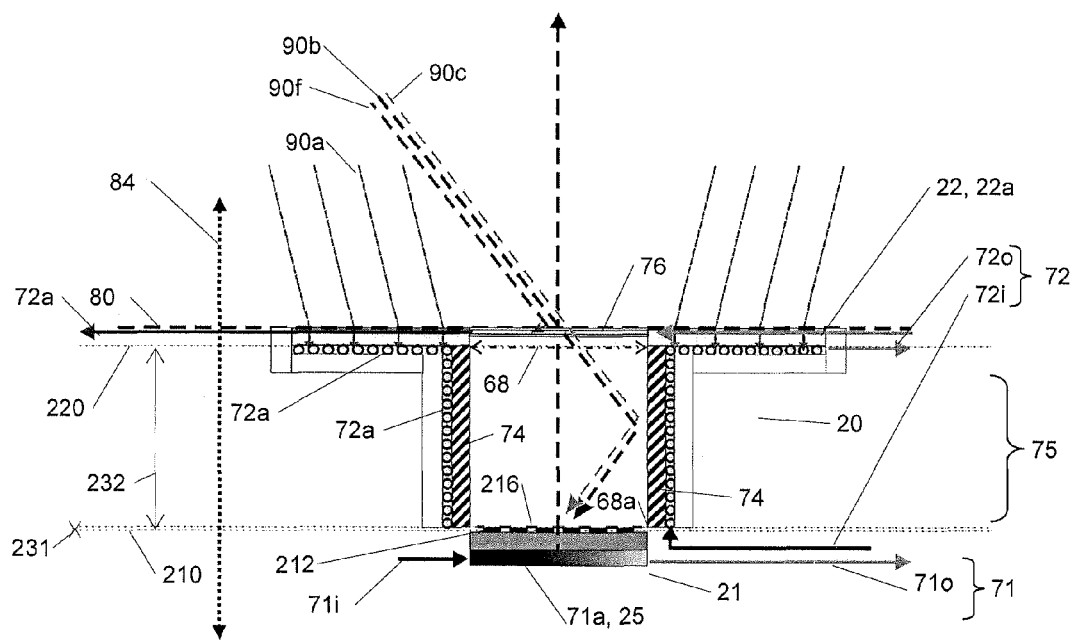
FIG. 9 is a section view of another photovoltaic thermal hybrid solar receiver.

The accompanying drawings are organized as follows:

Cooling devices 25 such as depicted FIG. 1-4 can advantageously be used to cool PV receivers, as shown in FIGS. 4 and 5. PV receivers 21 can advantageously be complemented by thermal collectors 22 such as depicted in FIGS. 6, 7. This results in hybrid receivers such as depicted in FIGS. 8, 9. The hybrid receivers can in turn be used in systems 10 such as depicted in FIGS. 10, 12-15.

Figure 19:
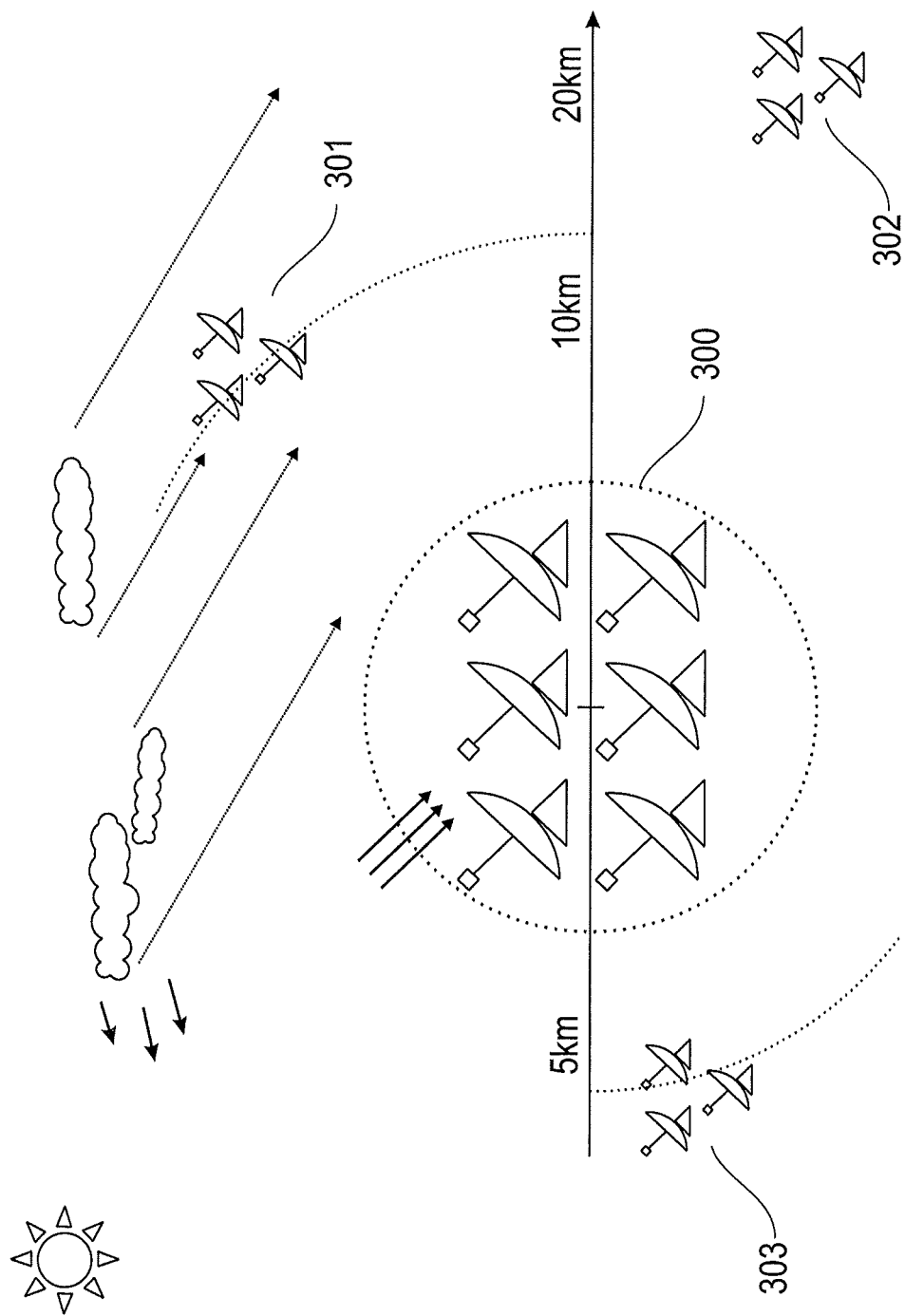
FIG. 19 is a simplified representation of a system for short-term local weather prediction using tracker solar sensor information.
Figure 20:
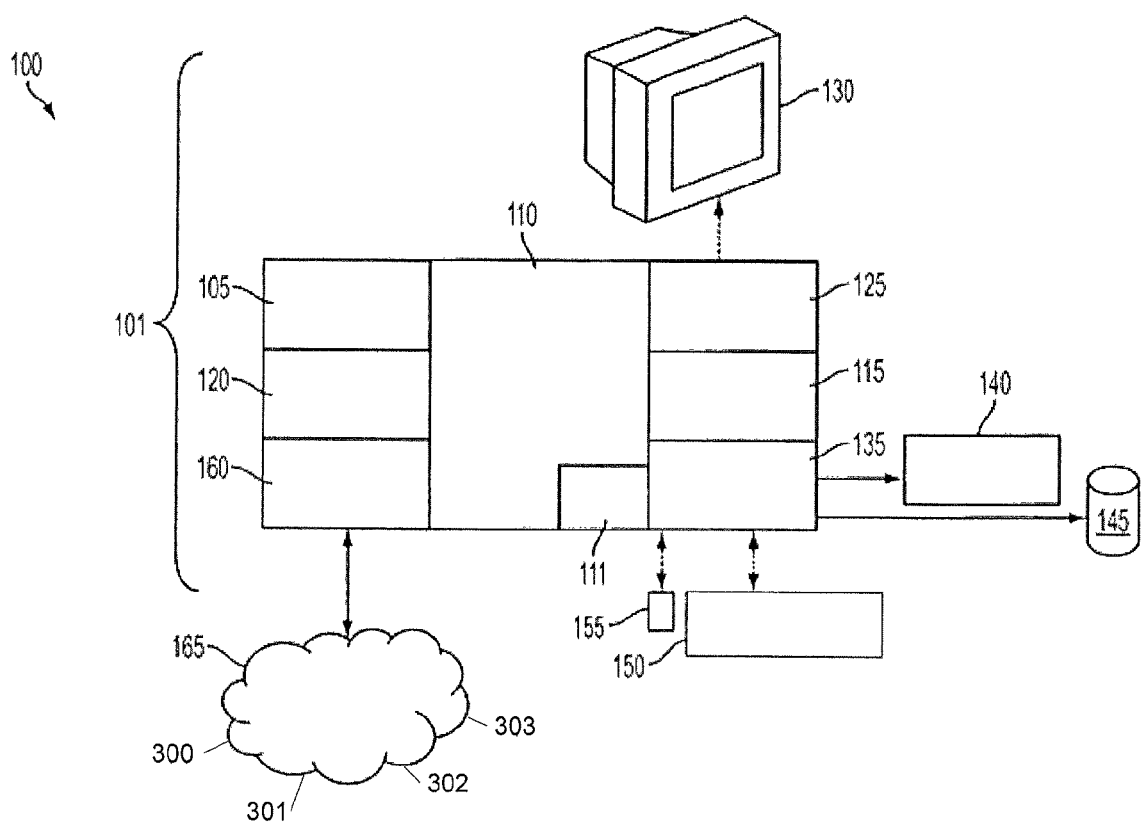
FIG. 20 schematically depicts an example of a control system—a computerized unit, suitable for implementing steps of methods of operation of systems such as depicted in FIGS. 10, 12-15, and 19.

The systems 10 can be complemented to enable short-term weather prediction, FIG. 19. The above systems 10 can be operated according to a method such as captured in the flowchart of FIG. 11. A control system to implement such a method is depicted in FIG. 20.

In FIGS. 1-5, the following notations are used:

$L_l$ denotes the $l^{th}$ level out of L total levels;

At level 1: $O_{ih}$ denotes the $h^{th}$ orifice of the inlet circuit ($O_{oh}$ is its counterpart for the outlet circuit);

Similarly, $CP_{ih}$ represents the $h^{th}$ channel portion of the inlet circuit, ($CP_{oh}$ pertains to the outlet circuit). For example, $CP_{i1}$ denotes the first channel portion of the inlet circuit, at level 1;

At level 2: $O_{ihk}$ represents the $k^{th}$ orifice arising from $CP_{ih}$; $CP_{ihk}$ denotes the corresponding channel portion;

At level 3: $O_{ihkl}$ represents the $l^{th}$ orifice arising from $CP_{ihk}$, $CP_{ihkl}$ denotes the corresponding channel portion, etc.

The number of indices hkl . . . used to tag a particular orifice or channel portion corresponds to the level that the orifice or channel belongs to. For example, $O_{ihk}$ belongs to level 2, while $O_{ihkl}$ belongs to level 3.

Referring to FIGS. 1-5 in general and more particularly to FIGS. 1 and 3, a chip module cooling device (or cooler) 25 as involved in embodiments includes two fluid circuits: an inlet fluid circuit i and an outlet fluid circuit o. Each circuit includes an arrangement of orifices $O_i$, $O_o$ and channel portions $CP_i$, $CP_o$. The orifices are also referred to as nozzles in some places below: they can indeed be given various appropriate shapes such as injection nozzles. This arrangement can be regarded as forming (or reflecting) a tree structure. An example of such a tree structure is depicted in FIG. 3, wherein: branches represent the orifices $O_i$, $O_o$ and nodes represent the channel portions $CP_i$, $CP_o$.

As generally known in tree structures, a branch links a node to one child node only; nodes sharing a same parent node are called siblings, or sibling nodes. Thus, channel portions corresponding to sibling nodes may be called sibling channel portions.

Each fluid circuit extends through L levels (i.e., $L_1$ to $L_3$ in FIG. 1) of the tree structure. The concept underlying the present cooling devices requires at least L≥3 levels. L can be larger, see e.g., FIG. 3. In FIG. 1, level $L_4$ could be regarded as an additional level of the tree structure. However, $L_4$ includes a modified orifice structure; it further includes channel portions of a heat exchanger, which shall be described later.

The circuits connect to each other at (or after) a final level (i.e., a lowest level of the tree structure), via channel portions corresponding to leaf nodes of the tree structure. The connection of the fluid circuits can be realized directly via the final "leaf" channel portions, or not. The connection may for instance involve additional orifices or any sort of connecting structure (channels, slits, etc.) "after" the leaf channel portions in the tree structure. Examples are given below. The additional mechanism need not be reflected in the above tree structure. Fluid communication from the inlet to the outlet fluid circuit is nonetheless enabled via a lowest level of the tree.

Now, for each of the two fluid circuits, the channel portions corresponding to sibling nodes have to fulfill two conditions:

First, they are parallel to each other, i.e., the principal directions (or lines) of extension of sibling channel portions are parallel to each other. Parallel is here to be understood according to Euclid's definition of parallelism, i.e., it means strictly parallel and refers to two parallel distinct channel portions. In the example of FIG. 1, it can be seen that sibling channel portions are parallel; this for example is the case:

At level 2 ($L_2$): for channel portions $CP_{i11}$, $CP_{i12}$, and $CP_{i13}$ for inlet circuit i. The same occurs for the corresponding outlet channel portions $CP_{o11}$, $CP_{o12}$, and $CP_{o13}$; or At level 3 ($L_3$): for channel portions $CP_{o131}$, $CP_{o132}$, etc.;

Note that at level 1 ($L_1$), there is only one channel portion ($CP_{i1}$ or $CP_{o1}$) per circuit (i or o), forming only one channel.

Second, channel portions corresponding to sibling nodes extend along respective directions, none of which is parallel to the direction of extension of the channel portion corresponding to the parent node (compare e.g., $L_3$-channel portions to $L_2$-channel portions or $L_2$-channel portions to $L_1$-channel portions).

Provided that the directions do not intersect either (which shall improve compactness in fine), it follows that, each of the channel portions corresponding to sibling nodes extends along a direction which, together with a direction of extension of their parent node, form a pair of skew lines. This condition could be fulfilled at a given level, preferably more, of the tree structure and for each of the two fluid circuits. Siblings may span a plane parallel to the parent node of the sibling nodes. A sibling can thus be described as being "rotated", preferably by 90° (as is the case in FIG. 1 or 3), with respect to their parent channel portion. The extent of the rotation depends on the pattern drawn by the orifices, as to be explained in detail below.

Channel portions may advantageously fulfill the additional conditions below:

Third, the channel portions corresponding to sibling nodes are preferably strictly parallel to channel portions corresponding to a grandparent node of the sibling nodes, if any. This is notably the case in FIG. 1 for all $L_3$-channel portions ($CP_{o131}$, $CP_{o132}$, etc.) that are parallel to $CP_{o1}$ or $CP_{i1}$ of level 1. It can be realized that this third condition allows for improved compactness, simplifies the design and thus eases the manufacture of the device, all the more if L>3. However, this is not a strict condition (especially if L=3). For example, $L_3$-channel portions could extend not parallel to their $L_1$-grand-parent channel portions, without critically impacting essential properties of the device. This could for instance be the case if other constraints (components, manufacture) oblige to shift grand-parent channel portions from their ideal direction of extension.

Fourth, channel portions corresponding to sibling nodes preferably span a plane parallel to channel portions corresponding to a parent node. Again, this may improve compactness and/or simplify the design and manufacture. This fourth condition is however not strict as the parent channel portions could extend in a same plane as the sibling channel portions (though rotated with respect to the latter). In particular, in FIG. 1, it can be seen that:

Channel portions $CP_{i11}$, $CP_{i12}$, and $CP_{i13}$ are open on an upper plane of component 211, which upper plane is (strictly) parallel to the main direction of extension of channel portion $CP_{i1}$ (the parent node of $CP_{i11}$, $CP_{i12}$, and $CP_{i13}$).

However, the main direction of extension of $CP_{i1}$ is close to or can even be included in the average plane spanned by the main directions of extension of $CP_{i11}$, $CP_{i12}$, and $CP_{i13}$. Because there are only one inlet channel and one outlet channel at level 1, the latter can nonetheless be easily integrated in a same device block 251 as their child channel portions. Yet, because of the layer structure adopted in the example of FIG. 1, channel portions of level 3 do not belong to the same layer as the channel portions of level 2. Channel portions corresponding to sibling nodes of level 3 now span a plane strictly parallel to channel portions corresponding to a parent node. Thus, one understands that sibling channel portions may advantageously span a plane parallel to their parent, subject to other constraints.

Finally, channel portions of the inlet circuit (for example $CP_{i11}$, $CP_{i12}$, and $CP_{i13}$) are parallel to and interdigitated with channel portions of the outlet circuit (for example $CP_{o11}$, $CP_{o12}$, and $CP_{o13}$). Interdigitation means an interlinking, evoking fingers of two hands locked together, as illustrated in FIG. 1 or FIG. 3. Owing to the conditions that the device already fulfills, Interdigitation involves channel portions corresponding to a same level of the tree structure.

A similar arrangement is shown in FIG. 3. What FIG. 3 actually depicts is a 3D tree structure, i.e., a tree abstraction, representing an arrangement of orifices and channel portions. However, it should be realized that a cooling device may be embodied with a geometry of channels as depicted in FIG. 3. In FIG. 3, for each of the inlet/outlet fluid circuits (i, o), channel portions corresponding to sibling nodes fulfill the same conditions as described earlier. Namely:

First, siblings are parallel to each other, as for example is the case for: Channel portions $CP_{i11}$ and siblings; the same occurs for their outlet counterparts (channel portions are not all referenced, for clarity); or Channel portions $CP_{i111}$ and parallel siblings; and again, at level 1, there is only one channel portion $CP_{i1}$ for the inlet circuit (and similarly for the outlet circuit). Second, they are not parallel to channel portions corresponding to a parent node of the sibling nodes (compare e.g., $CP_{i111}$ to $CP_{i11}$); they are instead rotated by 90°. Third, siblings are further parallel to channel portions corresponding to a grandparent node of the sibling nodes. This is notably the case for all channel portions of level 3 ($CP_{i111}$ and siblings, inlet circuit) that are parallel to their unique grand-parent channel ($CP_{i1}$, level 1, inlet circuit). Fourth, channel portions corresponding to sibling nodes (e.g., $CP_{i11}$ and siblings, inlet circuit) span a plane, which, in the embodiment of FIG. 3, is strictly parallel to channel portions corresponding to a parent node (e.g., $CP_{i1}$, inlet circuit).

A structure such as described above allows for achieving a dense and homogeneous arrangement of channels at the heat exchange level, i.e., "after" the leaf level. In some cases at least, the third condition above further improves final compactness. The fourth condition may be omitted, depending on the number of grand-parents. Interdigitation results in a homogeneous distribution of channels and allows for minimizing fluid trajectory. The fractal-like pattern that results from channel subdivisions and rotations makes it possible, notably, to optimize heat exchange. In addition, particular implementations allow for minimizing the required pumping power for the coolant flow. Detailed examples are given below.

In addition, such a structure and its building principle are easily scalable, which is advantageous for e.g., multichip photovoltaic cells as the dimensions of the latter can substantially exceed typical integrated circuit (IC) chips.

Tests performed by the present inventors have shown that usual chip cooling devices (wherein fluid circuits can be seen as subdividing into a single level of multiple nozzles/channels) can be successfully used to cool down classical IC chips, without unreasonable pumping effort. Scalability is therefore not an issue for cooling classical IC chips. Now, classical IC chip cooling devices are not suitably dimensioned for multichip photovoltaic cells. Should one nonetheless want to use classical cooling devices for (larger) multichip photovoltaic devices, one may first be tempted to parallelize such classical cooling devices, owing to the dimensions of multichip photovoltaic devices compared to usual IC chips. However, experiments have shown that this is inappropriate, because some regions of the multichip photovoltaic devices shall not be satisfactorily cooled, due to the inhomogeneous cooling obtained by the parallel cooling devices. Next, should one want to scale a classical IC chip cooling device to typical multichip photovoltaic device's dimensions (wherein dimensions are likely multiplied by a factor >5 compared to a typical IC chip), another issue arises. In that case, present inventors have realized that scaled cooling devices require a (too) large pumping effort.

On the contrary, a cooling device comprising a multilevel and interdigitated arrangement of orifices/channel portions as described earlier is scalable, by construction. Such a building principle further allows for reaching a dense arrangement of channel portions at the leaf level, owing to the successive rotations of channel portions. Dimensions of cross-sections of both the channels and nozzles shall likely decrease from one level to the other, as the number of channel portions and nozzles increases from one level to the other. It can be realized that the height of the channels is not that critical: for instance, in embodiments, the height of the channels extends perpendicularly to the thickness of a layer wherein the channel is provided. However, the width of the channel portions (in the cross-section, perpendicular to the in-channel flow direction) shall typically decrease. In other words, if the density of the channels is maximal at level n, the channel sections shall likely be larger at level n−1 than at level n. A structure as described above allows for reducing the flow path to and within the heat transfer structure; it further allows for scalability while keeping a moderate pumping effort.

Typically, each of the two fluid circuits includes, at each level $L_l$ ($1 \leq l \leq L-1$):

$N_l$ orifices (or nozzles), each leading to a respective channel portion. An orifice typically branches in the middle of the respective channel portion, except at edges of the device. Other branching geometry can be contemplated, which however are expected to be less efficient; and $N_l$ parallel channel portions. In turn, each of the $N_l$ channel portions shall enable fluid distribution to $B_{l+1}$ orifices of the next level $L_{l+1}$, where $B_{l+1}$ is a branching factor, defined by $B_{l+1}=N_{l+1}/N_l$. Successive subdivisions of the channel circuits require $B_2 \geq 2$ and $B_3 \geq 2$; $B_1$ can be assumed to be equal to 1. For example, in FIG. 3:

$O_{i1}$ leads to $CP_{i1}$ (level 1, $B_1=1$);

$CP_{i1}$ subdivides via $O_{i11}$, $O_{i12}$ and $O_{i13}$ into respective channel portions ($CP_{i11}$ and siblings, level 2, $B_2=3$);

Each of the $L_2$-channel portions ($CP_{i11}$ and siblings) leads to four channel portions. For example, $CP_{i11}$ leads to $CP_{i111}$ (via $O_{i111}$), as well as to three other parallel channel portions (siblings) via respective orifices; $CP_{i12}$ leads to $CP_{i121}$ as well as to three other parallel channel portions (siblings), etc. Thus, at level 2: each channel portion of the inlet circuit enables fluid distribution to $B_3=4$ inlet orifices (e.g., $O_{i11k}$, k=1, 2, 3, 4) of the next level $L_3$. The same holds for channel portions of the outlet fluid circuit.

In other words, the tree structure underlying each fluid circuit is typically balanced, as illustrated in FIG. 3, i.e., the branching factor $B_{m+1}$ is preferably the same for each channel portion at a given level $L_m$, whereby both the design and the manufacture of the device are made easier.

Next, the arrangement of orifices/channel portions can be designed such that each circuit has exactly the same geometry, which simplifies the manufacture and assembly of the device. Meanwhile, the arrangement can be designed to optimize the fluid distribution at a leaf level, i.e., in the vicinity of the heat exchanger. One possibility is to have, at a given level $L_m$ ($2 \leq m \leq L$), the positions of orifices of one fluid circuit correspond to a first set of discrete points of a first finite array. In analogy with 2D crystallography, this first array may be regarded as generated by a set of discrete translations R, i.e., defined by $R=n_1 a_1+n_2 a_2$, where $n_1$ and $n_2$ are integers and $a_1$ and $a_2$ are linearly independent vectors (as defined in linear algebra). Channel portions at level $L_{m-1}$ extend along or parallel to $a_1$ and channel portions at levels $L_m$ extend along or parallel to $a_2$. Finally, the positions of orifices of the other fluid circuit may correspond to second set of discrete points of a second finite array, translated from the first array by a translation r defined by $r=x_1 a_1+x_2 a_2$, with $0<x_1<1$ and $0 \leq x_2<1$. Preferably, on chooses $x_1=x_2=1/2$, which optimizes the homogeneity of the fluid distribution at the level of the heat exchange. Choosing $x_1$ or $x_2 \neq 1/2$ would instead induce heterogeneity in the set of trajectories throughout the fluid structure and therewith would cause heterogeneous fluid distribution within the heat exchanger, resulting in heterogeneous cooling. Note that for $m \leq L-1$, we have $0<x_1<1$ and $0<x_2<1$, while for m=L, we have $0 \leq x_1<1$ and $0<x_2<1$ or $0 \leq x_1<1$ and $0 \leq x_2<1$. Also, as a consequence of the above arrangement, the $N_l$ channel portions at level $L_l$ are rotated with respect to channel portions of the next/previous level, typically by an angle $\alpha=\pi/2$ for a square lattice, as illustrated in FIG. 3.

Should the basis unit of the lattice differ (e.g., oblique lattice), then channel portions corresponding to child nodes of a given parent node would be rotated by an angle $\alpha$ with respect to the parent channel portion and grand-child channel portions would preferably be rotated by an angle $\pi-\alpha$, to be in phase with the parent.

For example, in FIG. 3, at level $L_3$, the positions of {, $O_{i111}$, $O_{i121}$, $O_{i112}$, . . . } map onto a first array, generated by translations $R=n_1 a_1+n_2 a_2$. Channel portions at level $L_2$ (e.g., $CP_{i11}$ and siblings) extend along or parallel to $a_1$ and channel portions at levels $L_3$ extend along or parallel to $a_2$. Finally, the positions of orifices of the other fluid circuit (not referenced for clarity) correspond to a second set of discrete points of a second array, at any level. $L_1$ to $L_3$ outlet orifices are translated from the first array by $r=(a_1+a_2)/2$. Next, in order to take account of edge effects, $L_3$-channel portions are modified: the leftmost inlet channel portions are reduced (compare $CP_{i111}$ to $CP_{i121}$) and the corresponding orifices branch at one end thereof; the outlet structure is simply rotated with respect to the inlet circuit ($\pi$-rotation around $O_{i1}$) and is still shifted. As a result, $L_4$ outlet orifices are translated from the first array by $r=a_1/2$ only, consistently with the fact that for m=L, the condition for $x_1$ and $x_2$ becomes $0 \leq x_1<1$ and $0<x_2<1$ or $0<x_1<1$ and $0 \leq x_2<1$, as noted above. Such an arrangement has several advantages: (i) it makes it possible for the inlet and outlet circuits to have exactly the same structure (outlet circuit is simply rotated with respect to inlet circuit); (ii) it furthermore equalizes the fluid trajectories from one circuit to the other at level 4 (the fluid path length between one inlet orifice to the closest outlet orifice is $|a_1|/2$; and (iii) the two circuits have the same footprint (square lattice).

Next, depending on the orifice arrangement, subsets of channel portions may rejoin to draw channel lines, at a given level (e.g., $CP_{i111}$, $CP_{i121}$ and $CP_{i131}$ form one such subset at level 3 in FIG. 3), or at several levels. Typically, two adjoining channel portions in any such subset are cousins (e.g., $CP_{i111}$ and $CP_{i121}$). Accordingly, it can be concluded that, in this example, any two channel portions at any level are either strictly parallel (like $CP_{i111}$ and $CP_{i112}$ siblings) or extend along a same line (like $CP_{i111}$ and $CP_{i121}$ cousins). In that respect, since a line can be defined by a point and a direction vector and two lines can be defined as parallel if their direction vectors are, two identical lines are parallel according to this definition, even if they are not according to Euclid's definition (where two parallel distinct lines are called strictly parallel). Thus, any two channel portions at any level are at least non-strictly parallel.

Note that a design option such as discussed in the previous paragraph might be implied by the positions of the orifices, in particular if the latter map onto an array as discussed above. In all cases, this design option substantially simplifies the geometry and manufacture of the cooling device, as subsets of channel portions extend along a same direction. A given channel line shall include channel portions arranged in-line, wherein fluid communication is possibly enabled from one channel portion to another. Whether to do so shall actually depend on various parameters, flow rates, channel sections, etc. For example, each of the fluid circuits i, o may include (at least in one level $L_l$ thereof): $N_l$ channel portions forming $Nc_l$ strictly parallel channel lines $C_i$, $C_o$, wherein each of the $Nc_l$ channel lines includes channel portions arranged in-line. In fact, at a given level, sibling channel portions are strictly parallel (e.g., FIG. 3, $CP_{i111}$ and $CP_{i112}$, level 3), but some of the channel portions that have different parents (e.g., $CP_{i111}$, $CP_{i121}$ and $CP_{i131}$) may be arranged in-line, resulting in $Nc_l$ parallel channels ($Nc_3$=4 at level 3 in the example of FIG. 3). The channel portions arranged in-line are not necessarily in fluid connection: one may for example have walls between the channel portions arranged in-line or the channel portions. Note that one necessarily has $B_l \leq Nc_l \leq N_l$, from the above definitions.

A particularly simple design is obtained by setting $Nc_l=B_l$, whereby $Nc_l$ parallel channel lines correspond to $Nc_l$ parallel lines of orifices, as illustrated in FIG. 3, level 3. Accordingly, each of the fluid circuits may include $N_l$ channel portions forming $B_l$ strictly parallel channel lines. In that case, each channel line includes $B_{l-1}$ channel portions arranged in-line (and this, possibly at each level $L_l$). Again, channel portions in a given channel line may be connected to enable fluid communication from one channel portion to another. Now, one channel line may include a unique channel portion. For example, at level 1, one has $C_{i1}=CP_{i1}$, assuming $B_o=1$ in that case; at level 2, one has $C_{i11}=CP_{i11}$, etc., since $B_1=1$. However, at level 3, there are $Nc_3=B_3=4$ parallel channel lines (for each fluid circuit), which lines correspond to respective parallel lines of orifices and include, each, 3 orifices and 3 respective channel portions ($B_2=3$).

In addition, it is desirable to further improve the compactness of the arrangement, to minimize the fluid trajectories. To that aim, $Nc_l$ strictly parallel channel lines $C_i$ of the inlet fluid circuit may advantageously be interdigitated with $No$ strictly parallel channel lines $C_o$ of the outlet fluid circuit, at a given level $L_m$ ($1 \leq m \leq L$). Accordingly, each channel line of the inlet fluid circuit results to be parallel to each channel line of the outlet fluid circuit at that level $L_m$. Interdigitation of channel lines can actually be provided at several levels, and more preferably at each level where channel portions can form channel lines), to increase compactness. In that respect, it should be borne in mind that FIGS. 1 and 3 depict simple examples, but additional levels (and layers) of channel portions may actually be contemplated.

Next, a specific pattern of channel portions shall be discussed in reference to FIG. 1 (enlarged "B" area) and FIG. 2 (focusing on the specific pattern shown in the enlarged "B" area, designed for sublayer $sL_{32}$ of the device of FIG. 1). Namely, at a given level $L_m$ and for each of the fluid circuits, at least some of the $N_m$ channel portions may be designed to have a non-constant cross-section. As seen in FIG. 2, inlet and outlet channel portions can be suitably shifted (i.e., interdigitated) to maintain a compact arrangement (compare e.g., $CP_{i124}$ to $CP_{o124}$). More specifically, the channel portions may, each, include an enlarged area vis-à-vis a respective one of the $N_m$ orifices, to improve fluid distribution from/to orifices of the respective channel portions (at a given level $L_m$).

Additional design options can be contemplated, which take account of edge effects. For example, at a given level $L_m$ (e.g., $L_3$ in FIG. 1) two sets of orifices (e.g., $O_{i11k}$ and $O_{o13k}$, k=1, 2, . . . ), each comprising $B_m$ orifices, are arranged in correspondence with respective outermost channels (e.g., $CP_{i11}$ and $CP_{o13}$) of a previous level $L_{m-1}$. Then, each of the $B_m$ orifices of the two sets and/or each of their respective channel portions may have reduced dimensions along a particular direction of extension of the channels at level $L_m$ (i.e., direction x in FIG. 1).

The cooling device may further include a heat transfer structure 24, in addition to a manifold system, to supply and drain liquid to and from the heat transfer structure, as illustrated in FIG. 1 and FIG. 4. In variants, the heat transfer structure 24 could be first integrated to a photovoltaic module, and later be connected to the cooling device. In all cases, the heat transfer structure 24 can be configured to connect one of the fluid circuits to the other. The heat transfer structure preferably includes silicon, and is more preferably entirely made of silicon, for reasons that will be discussed later.

The heat transfer structure may for instance include heat transfer channel portions (e.g., $CP_{t1311}$, $CP_{t1312}$ in FIG. 1, enlarged area "D"). Each of the transfer channel portions connects at least one channel portion (e.g., $CP_{i131}$ in FIG. 1) corresponding to a leaf node of the inlet fluid circuit to one channel portion (e.g., $CP_{o131}$ in FIG. 1) corresponding to a leaf node of the outlet fluid circuit.

Preferably, each heat transfer channel portion extends along a direction rotated with respect to a direction of extension of the channel portions that it connects, following the same principle as already discussed in respect of the tree-structured channel portions of the cooling device.

Similarly, heat transfer channel portions may connect the lowest-level channel portions via slits (e.g., $S_{i131}$ and $S_{o131}$ in FIG. 1), following the same principle as for orifices nozzles discussed thus far, except that the dimensions typically involved at the level of the heat transfer structure make it preferable to have a slit instead of a dense in-line arrangement of orifices, for manufacturability reasons. Yet, a slit can be seen as the asymptotic limit of such an arrangement. In that sense, the heat transfer structure can be regarded as forming or completing an additional level of the tree structure underlying each fluid circuit, e.g., level 4 in FIG. 3.

Next, the cumulated width of all orifices (in cross-sectional areas) of one of the levels is preferably kept substantially equal (e.g., to ±15%) to the cumulated width in cross-sectional area of all orifices of another, e.g., a contiguous level (and preferably of all of the other levels), in order to limit the pumping effort.

In an example, at a given level $L_m$:
the length of a channel portion (not at an edge) is $L_m=(L_1-W_{min})/B_{m-1}$; and
the width of a channel portion is $W_m=L_{m-1}/B_m/2-W_{min}$, wherein $W_m$ is a width of the channel portions at level m and $W_{min}$ is a minimal wall thickness. The above dimensions are valid if $W_m$ is the same for inlet and outlet channel portions and if it is constant for each portion, subject to edge effects.

The height of the channels may for instance be independent from one level to each other. Assuming that all levels should have the same footprint, the relationship between the lateral dimensions of the channels from one level to the next shall notably depend on the branching factor.

In terms of manufacturability, it may be advantageous to have one or more levels embodied, each, as superimposed sub-layers (e.g., $sL_{31}$ and $sL_{32}$ for level 3 in FIG. 1). In FIG. 1: a first sub-layer $sL_{31}$ includes orifices, whereas the second sub-layer $sL_{32}$ includes channel portions. Both the orifices and channel portions can be machined as through holes in their respective sub-layers, which makes the manufacture process easier. Superimposed layers may be made of different materials, if necessary, since the different dimensions and shapes of the channel portions vs. orifices may more easily be processed using different materials.

A cooling device such as described above is advantageously used together with a photovoltaic receiver 20, such as depicted in FIG. 8 or 9. This receiver may include a photovoltaic module 21, such as depicted in FIG. 4 or 5. The receiver shall further include a heat circuit portion 71*a* (FIG. 8, 9), connected to the photovoltaic module and the cooling device 25, the latter forming part of the heat circuit portion 71*a*.

Preferably, the above cooling device is used together with a photovoltaic thermal hybrid solar receiver 20, such as illustrated in FIG. 8 or 9. The latter further includes thermal collector 22, distinct from the photovoltaic module 21 of the receiver. In that case, the heat circuit portion 71*a* is a first heat circuit portion 71*a*, distinct from a second heat circuit portion 72*a*, that connects to the thermal collector. Such a photovoltaic thermal hybrid solar receiver 20 shall be described in detail below.

Cooling Devices: Specific Implementation Details

The cooling device is preferably designed to allow for cooling the cell package with elevated temperatures of the coolant while keeping the cell at a moderate temperature (<100° C.). This way the collected thermal energy is of high value due to its elevated temperature level.

For this purpose the cooling device is preferably designed to have minimal thermal resistance between the PV cells and the cooling fluid. A cooling device such as described above may provide thermal resistance of less 0.11 cm$^2$K/W. Assuming the PV cell is connected to the cooling device by a solder interface the total thermal resistance from the PV cell surface to the liquid coolant is around 0.17 cm$^2$K/W. This allows cooling for heat flux densities of more than 400 W/cm$^2$ while keeping the cell at less than 100° C. (assuming the fluid inlet temperature is 30° C.).

The cooler can be optimized to operate at low pumping powers, thereby reducing the energy needed to operate the system. The above solutions allow a homogenous cooling performance over an extended area ($\Delta T < \pm 0.2$ K) that can be easily scaled.

Reliability of the package may also be considered. A solution using silicon as substrate material allows a good thermal coefficient of expansion match between the PV cells (typically germanium) and the cooler, which reduces stress on the cells. Use of silicon further allows for using MEMS processes to structure cooler surface and implement sensing elements in the cooler (temperature, radiation, pressure . . . ).

Minimizing pumping power while maximizing temperature homogeneity across the cooler surface can be both achieved with an efficient manifold such as described above, i.e., a hierarchical fluid distribution/collection system with two main paths (fluid inlet and outlet).

A layer-wise implementation of distribution channels (manifold) and injection orifices (nozzles) allows for: using different materials and fabrication methods to cover the broad range of structure dimensions (e.g., from 20 μm to 20 mm or more); using different materials, which in turn allows for achieving low thermo-mechanical stress in the cooling layer, increasing the lifetime of the package, and scalability.

The cooler package is preferably fabricated using MEMS technology, taking advantage of definition and processing of microstructures, batch processing, bonding techniques, integration of sensing elements, etc.

In reference to FIG. 1, 4 or 5, this package typically includes a layer 21, on top, comprising PV cells 211, forming a multichip module 212, the PV cells connected by electrical interconnects (see below); bypass electrodes 213; and an electrical layer (214), to connect the bottom electrodes of the PV cells. Layer 21 may further contain: a sensor layer with a network of resistive temperature devices to map the temperature over the entire package right at the bottom of the PV cell (not shown); an insulation layer, to insulate the sensor layer to electrical layer (not shown). These layers are typically processed using thin film deposition techniques as well as galvanic processes. Solders can be applied by a galvanic process too or any conventional process like screen printing.

In the cooling sub-layers, micro channels can be fabricated by DRIE to enhance heat removal. These channels can be also fabricated using multiple dicing saws. In an orifice sub-layer (e.g., $sL_{31}$ in FIG. 1): orifices can be fabricated by DRIE. Die casting and other mass production processes can also be used to fabricate such a sub-layer.

A multichip module package including a cooling device as described above may include high efficiency triple junction solar cells (or "3JPV", commercially available) soldered onto a substrate with a minimal distance between each other; a cooler package (or heat sink) having a micro machined silicon wafer 24, i.e., a heat exchanger and carrier of electrical network, with a micro machined heat transfer structure on the bottom side, comprising channels (such as $CP_{t1311}$ in FIG. 1 or 4); integrated temperature sensors; an electrical network consisting of electrically conductive pads (214) which connect to the bottom electrode of a PV cell; a manifold system, for fluid distribution and collection, with one substrate combining orifice sub-layer $sL_{41}$ and manifold sub-layer $sL_{32}$ and one substrate with orifice sub-layer $sL_{31}$. With such a (specific) design, two sub-layers can be combined in a single substrate to take advantage of the specific process of double side DRIE. Doing so the number of components and interfaces can be reduced. In general layers should be combined if the process and the design allow, in order to reduce fabrication costs.

Electrical interconnects (including conductive pad 214, connection 216, etc.) which connect a top electrode of one cell to a top electrode of another cell in case of a parallel connection or which connect a top electrode of one cell to a electrically conductive pad 214 which is again connected to the bottom electrode of another cell in case of a serial connection (see below, 300 μm wire bond, soldered or welded Cu ribbon or lead frame). A carrier 251 for mechanical support and interface to larger system includes a manifold layer (embodying both levels $L_1$ and $L_2$), made of polymer, metal, composite materials, etc.

In reference to FIG. 5, a multichip module receiver package shall typically include, in addition to components described earlier, a shield 215 to protect components not meant to be exposed to radiation. In addition, the shield encapsulates the PV cell package to protect against dust, humidity, etc. The shield further includes a cover window 215a that can be used to filter radiation, if needed, see section 2.2. Shield walls 215b can be used as secondary reflectors to homogenize incoming radiation. The shield has a heat recovery system that can be coupled to the cooling loop, in series, or to a separate heat circuit, as described in detail below Photovoltaic Thermal Hybrid Solar Receivers In reference to FIGS. 6-10, novel photovoltaic thermal hybrid solar receivers 20 are now described. In each case, the hybrid receivers first include a thermal collector 22. The latter extends in a first plane 220, which plane typically is a main plane of extension of the thermal collector, i.e., the plane onto which radiation can be received and collected. The location of the first plane is preferably taken at the level of the average plane of the thermal collection panel of the collector, as depicted in FIG. 8 or 9. This thermal plane can therefore also be referred to as a 'shield', as done in some places below. In addition, the thermal collector includes an aperture 68.

The receivers 20 further include a photovoltaic module 21. Such a module is designed for delivering an electrical output power $P_O$, in operation, as known per se. The module notably includes a photo-active area 212 that extends in a second plane 210. The latter typically is a main plane of extension of the area 212, e.g., the average plane of the photo-active pane of the module. It is furthermore preferably parallel to the first plane, for both simplicity and efficiency reasons, though parallelism is not a requirement at all. In all cases the second plane 210 is located at a distance 232 (see FIG. 8 or 9) of the first plane 220 and the area 212 is located vis-à-vis the aperture 68. The projection of the aperture, i.e., perpendicularly to the second plane 210, corresponds to the photo-active area (or essentially corresponds to it). Here, 'essentially' means that the photo-active area may represent 80 to 100% of the projected area of the aperture.

The above design, wherein plane 210 is distant from the plane 220 and area 212 is set vis-à-vis aperture 68, allows for easily varying a ratio of radiation exposure of the photovoltaic module 21 to the thermal collector 22, e.g., by simply translating the device perpendicularly to plane 210, with respect to a radiation focus point or plane. This device accordingly makes it possible to rapidly "switch" from PV power delivery to thermal power storage.

Another advantage is that: when the light beam is defocused, the PV electrical output becomes smaller but the thermal output on the front target is larger. A benefit can therefore follows even with a misalignment. Thus, a less accurate tracker and a higher maximal optical concentration with a lower cost mirror can be reached.

In addition, the thermal collector and the photovoltaic module may be configured to protect peripheral regions of the photovoltaic module from radiation hitting the thermal collector. Namely, the thermal collector may be designed to protect peripheral regions of the main plane of the photovoltaic module and at least partly shields radiation received from a light source at the photovoltaic module, e.g., to protect passive diodes or passive components in the photovoltaic module.

Preferably, a hybrid receiver further includes a first heat circuit portion (ref. 71a in FIG. 8 or 9), thermally connected to the photovoltaic module (at the back thereof), and a second heat circuit portion (72a) thermally connected to the thermal collector. The circuit portions can be connected to respective heat circuit portions, typically closed-loop, as to be discussed below. The circuit portions 71a and 72b can be thermally insulated from each other, if necessary. Portion 71a or 72a, or both portions 71a and 72a could for instance be embodied as a cooling device such as described earlier, in section 2.1, see e.g., ref. 25 in FIG. 1 or 4.

Typically, the first circuit portion 71a is inserted in a first heat circuit 71, configured to cool the PV receiver, and the second circuit portion 72a is inserted in a second circuit 72, independent from the first circuit, and connecting in turn to a thermal storage, to serve a purpose described in the next section. In variants, the first portion 71a and the second portion 72a may be thermally connected, in series, in a same heat circuit, subject to additional constraints to be discussed later. For completeness, FIGS. 8, 9 show inlet/outlet circuit sections 71i, 71o, 72i, 72o, of respective circuits 71, 72.

The distance 232, as well as the distance 231 between the area 212 and a lower end 68a of aperture 68 both depend on a number of design and system options, which are discussed later in details (desired insulation, circuitry dimensions, presence of a homogenizer, a filter, a concentrator and characteristics thereof, translational speed and desired reactivity of the system, etc.).

For instance, the end 68a of the aperture 68 that is the closest to the photo-active area 212 is preferably kept at a (small) distance from this area 212, as illustrated in FIG. 8, to ensure thermal insulation. Typically, this end of the aperture 68 is located at a distance larger than or equal to 0.2 mm, which may already suffice to insulate the thermal collector from the PV receiver, as tests have demonstrated (air can be used as insulating medium). However, depending on the PV module size and cooling circuit temperature used, this distance may need to be larger than or equal to 0.5 mm, and/or other insulating material may be used. On the other hand, this distance is preferably smaller than or equal to 3.0 mm. Indeed, it can be realized that this gap needs to be small enough so that light cannot "escape". Namely, light exiting the aperture has a defined angle, the above distance is therefore designed small enough so that outcoming rays shall not hit the periphery of the active area. Depending on other device specifications, this distance may more preferably be smaller than or equal to 2.0 mm, and even more preferably 1.0 mm. The accompanying figures are obviously not to scale, at least not in respect of every feature shown.

Now, it can be realized that, since (i) minimal thermal circuit sections typically have a diameter of 5 mm, and (ii) the end 68a is located at a distance larger than 0.2 mm, then the minimal distance 232 need be larger than 2.7 mm. Instead, using a 6 mm circuit diameter would bring this value to 3.2 mm. This minimal distance is increased if, in addition, an intermediate homogenizer is used (e.g., at least 10 mm, optimally 60 mm long for an aperture of approximately 35×35 mm and an light incidence angle of 53°, the rim angle of the parabolic dish). More generally, if no homogenizer is provided, the minimal distance 232, FIG. 8, is determined by the dimensions of the thermal collector (that includes thermal circuit 72a, panels, etc.).

Note that, at variance to FIG. 8 or 9, the thermal collector 22 may include a tapered aperture section, i.e., with a non-constant cross section. In that case, the end 68a of the aperture 68 would correspond to a smallest cross sectional area of the non-constant cross section.

As evoked earlier, the thermal collector may further include one or more mirror elements 74 (see FIG. 6, 7 or 9), for example a light homogenizer or, more generally, optics, i.e., secondary optics (beyond a concentrator), in an intermediate section 75 between the first plane 220 and the second plane 210. Such mirror elements can be configured to specifically reflect incoming light 90a-c and distribute reflected light 90b-c onto the photo-active area 212, as illustrated in FIG. 9. For example, mirror elements may be configured to homogenize and/or further concentrate reflected radiation 90b-c onto area 212. To that aim, simple possibilities consist of having at least three or four mirror elements 74, forming a closed hollow section 75, as depicted in FIG. 6, 7, or 9. Yet, a single tubular mirror could be used.

Figure 10:
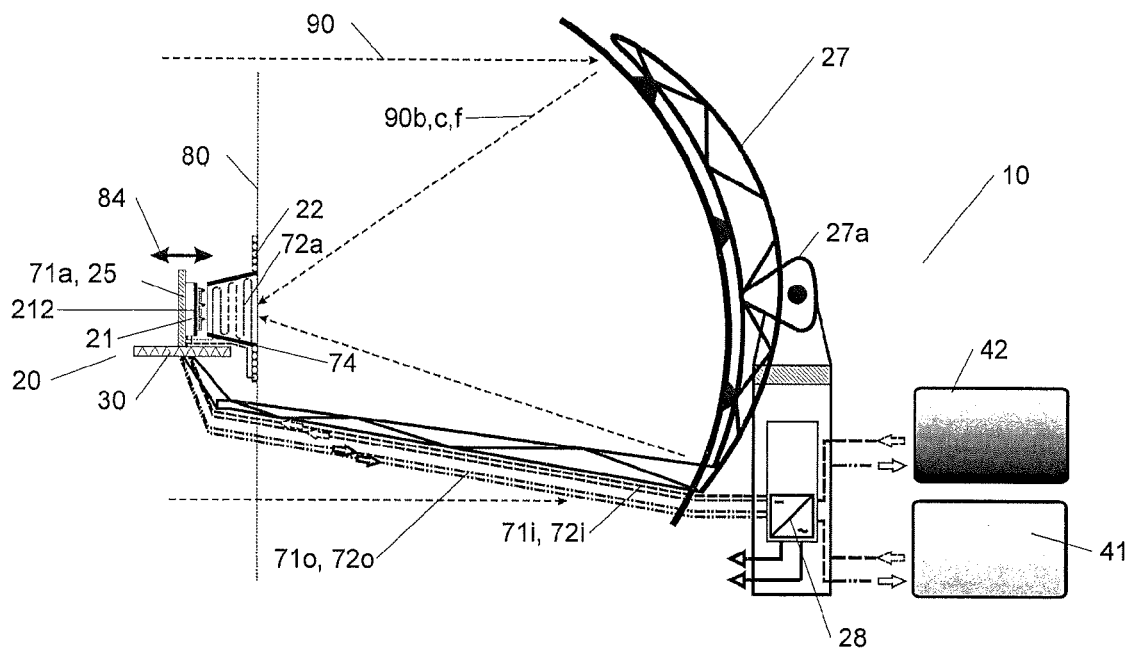
FIG. 10 is a side view of a photovoltaic thermal hybrid solar system.

Advantageously, the one or more mirror elements 74 are thermally connected to the second heat circuit portion 72a, such as to benefit to a corresponding heat circuit. In that case, optimal results shall be obtained if a part, at least, of the circuit portion 72a is coiled around the mirror elements, as shown in FIG. 9 or 10. The needed circuitry can for instance be suitably molded or arranged in an insulating body, as better seen in FIG. 7, wherein sections 72a1-7 of the second heat circuit portion are visible.

Interestingly, the thermal collector may further include a bandpass filter 76 (see FIG. 7 or 9), e.g., at the level of an upper end of the aperture 68 and fit within the aperture, to specifically select a bandwidth where conversion efficiency of the PV cells is optimal. A passband which is optimal for purposes described later is 350-1500 nm, i.e., it corresponds to the spectrum where preferred PV cells have a conversion efficiency larger than 80%. Preferred PV cells are typically multi junction solar cells, e.g., from Boing Spectrolab, Emcore, Azur Space amongst others.

Advantageously, the filter can further be designed to thermally absorb radiation wavelengths outside the passband, i.e., to benefit again to a heat circuit, preferably the second heat circuit 72, in form of higher grade thermal energy.

In that respect, the filter may include a hollow cavity filled with a cooling fluid 77 (see FIG. 7), in fluid communication with a heat circuit, e.g., circuit 72. Other options are discussed later.

Figure 12:
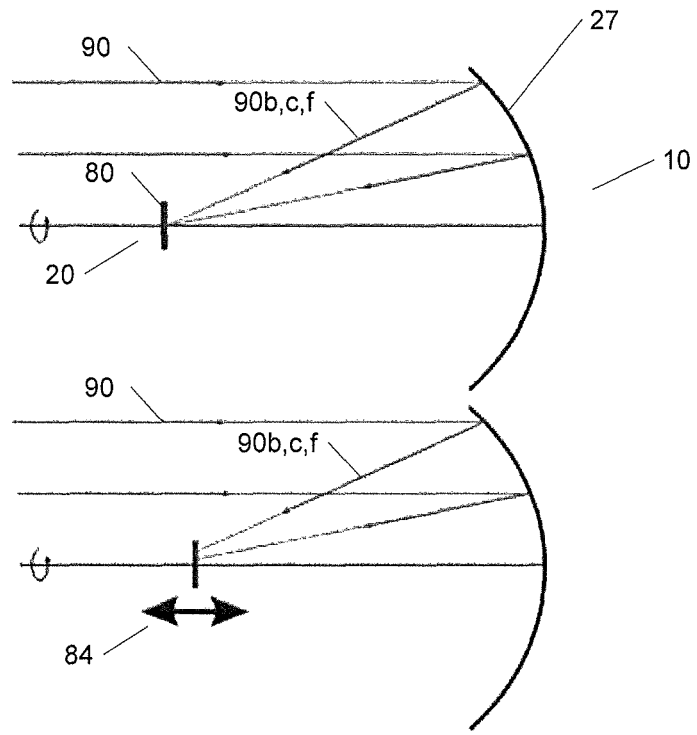
FIGS. 12-13 are simplified representations of photovoltaic thermal hybrid solar systems.
Figure 13:
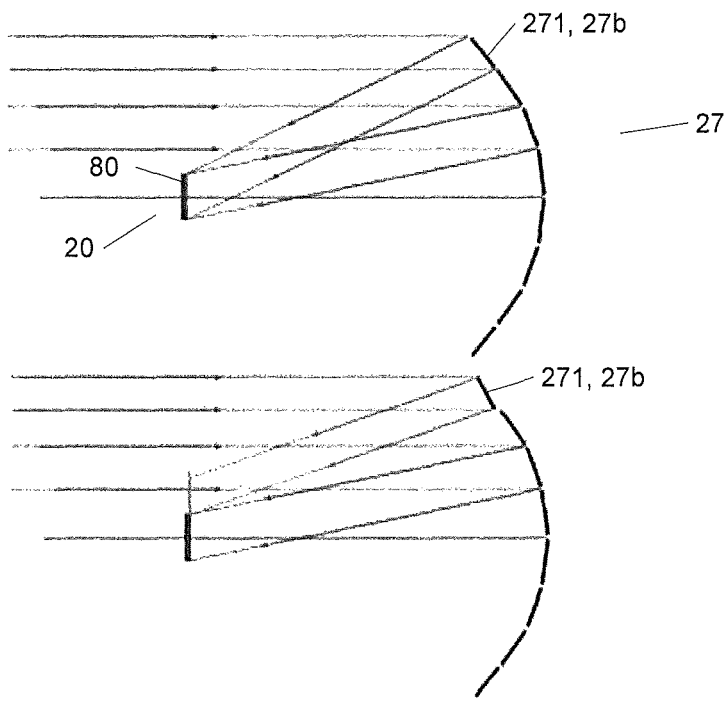

Next, hybrid receivers 20 such as described above can advantageous be used in an apparatus 10 such as depicted in FIG. 10 (or more schematically in FIG. 12 or 13). Such an apparatus shall further include a concentrator 27. The latter is designed and configurable to concentrate radiation towards an optical focus 80, as known per se. The optical focus 80 is a region of maximal intensity of concentrated light, e.g., essentially located to small volume or confined close to a plane, e.g., plane 80, depending on actual implementations.

The apparatus (or the concentrator device itself) further includes positioning mechanism 27a, 27b, 30, which can have various purposes. In that respect, the receiver and/or the concentrator can be movably mounted in the apparatus via the positioning mechanism.

For example, the positioning mechanism may be configured to change a ratio of intensity of radiation 90b,c received at the photovoltaic module to intensity of radiation 90a received at the thermal collector. Because of their relative dimensions, it shall likely be simpler to make the hybrid receiver movably mounted in the apparatus 10 via positioning mechanism 30 rather than the concentrator. The receiver can further be movable with respect to the optical focus 80. Accordingly, the receiver and/or the concentrator are movable (e.g., along bi-directional axis 84) by the positioning mechanism from a position where the photovoltaic module 21 is in the optical focus 80 to a position where the thermal collector 22 is in the optical focus.

Changing the ratio of intensity evoked just above is accordingly very easily obtained, e.g., via a simple translation of the receiver and/or the concentrator. In this regard, the positioning mechanism may simply be embodied as one of: a linear actuator, such as a rack and pinion; or a vehicle, such as a wheeled vehicle, a tracked vehicle, or a railed vehicle, for example comprising a trolley, a bogie, etc. more generally, the positioning mechanism 30 preferably enables bidirectional motion along an axis 84 perpendicular to second plane 210. The mechanism 30 is preferably specifically dedicated to the task of changing the above ratio, and possibly to that task only. Usual tracking systems do not enable suitable bidirectional motion along axis 84, in operation. Indeed, in prior systems, the receiver's position is refined during setup but it is then fixed (definitively) for the life of the system for standard systems.

Now, the concentrator 27 or one or more elements 271 thereof may further be movably mounted in the apparatus via other positioning mechanism 27a, 27b, as schematically depicted in FIGS. 10, 12, and 13.

FIGS. 12-13, which are simplified representations of two hybrid systems, illustrate the variation of the spot geometry at the receiver. In each case, the upper drawing represents a configuration for which the spot is focused at the receiver plane, while the spot is defocused in the lower drawing. In addition, in FIG. 12, a classical parabolic concentrator (mirror) 27 is used, while in FIG. 13, the concentrator includes a plurality of mirrors 271, which can be actuated by respective positioning mechanism 27b, to change the spot geometry at a receiver plane (210 or 220, in FIG. 8-9).

As schematically illustrated, the spot geometry at a receiver plane can be changed by:

FIG. 12: displacement of the receiver along the optical axis 84, e.g., in a rotational symmetric parabolic concentrator, should a homogenizer be involved or not; and/or FIG. 13: changing the shape of the primary concentrator, for example by tilting of one or more (flat) elements 271 of a faceted mirror.

In addition, one may defocus the spot by changing the curvature of the main mirror or the one of secondary optics in a folded beam arrangement.

As touched above, to move the receiver module 20 out of focus, the receiver can be mounted on a movable stage. The stage can be actuated by a shaft and a stepper motor that are themselves mounted in a fix position in reference to the focal plane of the concentrator system. This adjustable receiver positioning unit represents a control element 30, symbolically represented by reference 30 in FIG. 10. Alternatively the stage with the receiver can be moved using a hydraulic or pneumatic actuated piston, etc.

Figure 16:
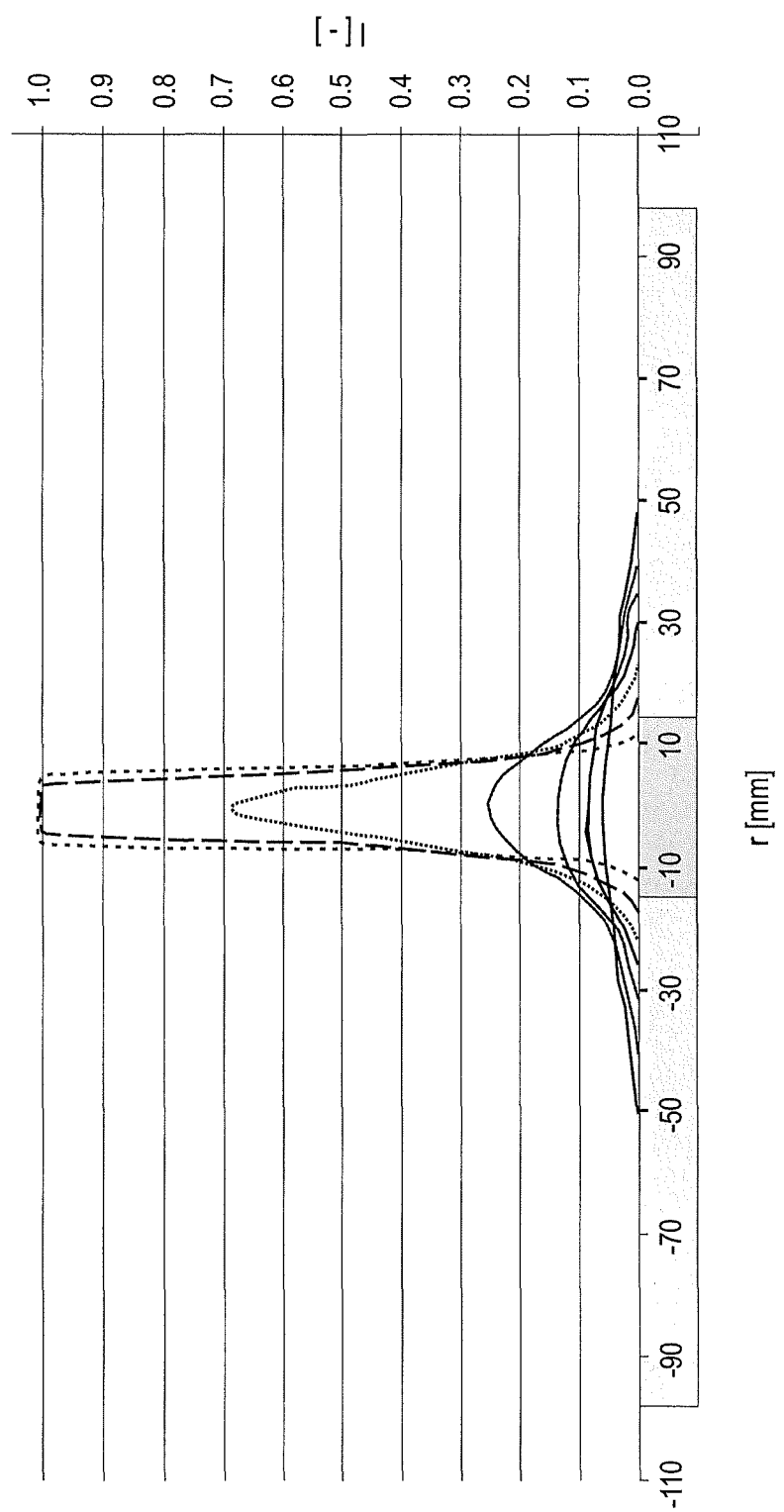
FIG. 16 is a graph showing the radiation intensity distribution at the level of an input plane of a hybrid receiver, while displacing the hybrid receiver along the optical axis of the system.

FIG. 16 shows typical cross sections of the intensity distribution (normalized intensity) at the PV receiver module plane (ref. 220 in FIG. 8-9), when using a rotational symmetric parabolic primary concentrator, for a receiver module displaced along the optical axis of the system. The x-axis represents a distance r (mm) along a section passing through the aperture, where r=0 corresponds to a center of the aperture (typically a symmetry center). The darker gray box corresponds to the aperture, while the lighter gray boxes denotes the shield, i.e., the thermal panel of the collector 22 extending parallel 220 to the receiver PV module plane 220. As indicated by the various curves represented in FIG. 16, a light beam can be focused such that the radiation intensity distributes mostly or essentially within a zone corresponding to the aperture (this intensity shall accordingly be converted to electrical power thanks to the PV cells).

Defocusing the spot (or altering the mirror shape/elements) results in widening the intensity profile, such that radiation becomes essentially collected at the shield.

In that respect, the shield 22a (FIGS. 6-9) is preferably made substantially larger than the aperture 68. Typically, the aperture's dimensions (e.g., between 10×10 and 30×30 mm) reflect that of the PV-MCM, while the overall shield dimension can reach 200×200 mm or more (e.g., 500×500 mm is possible).

Figure 17:
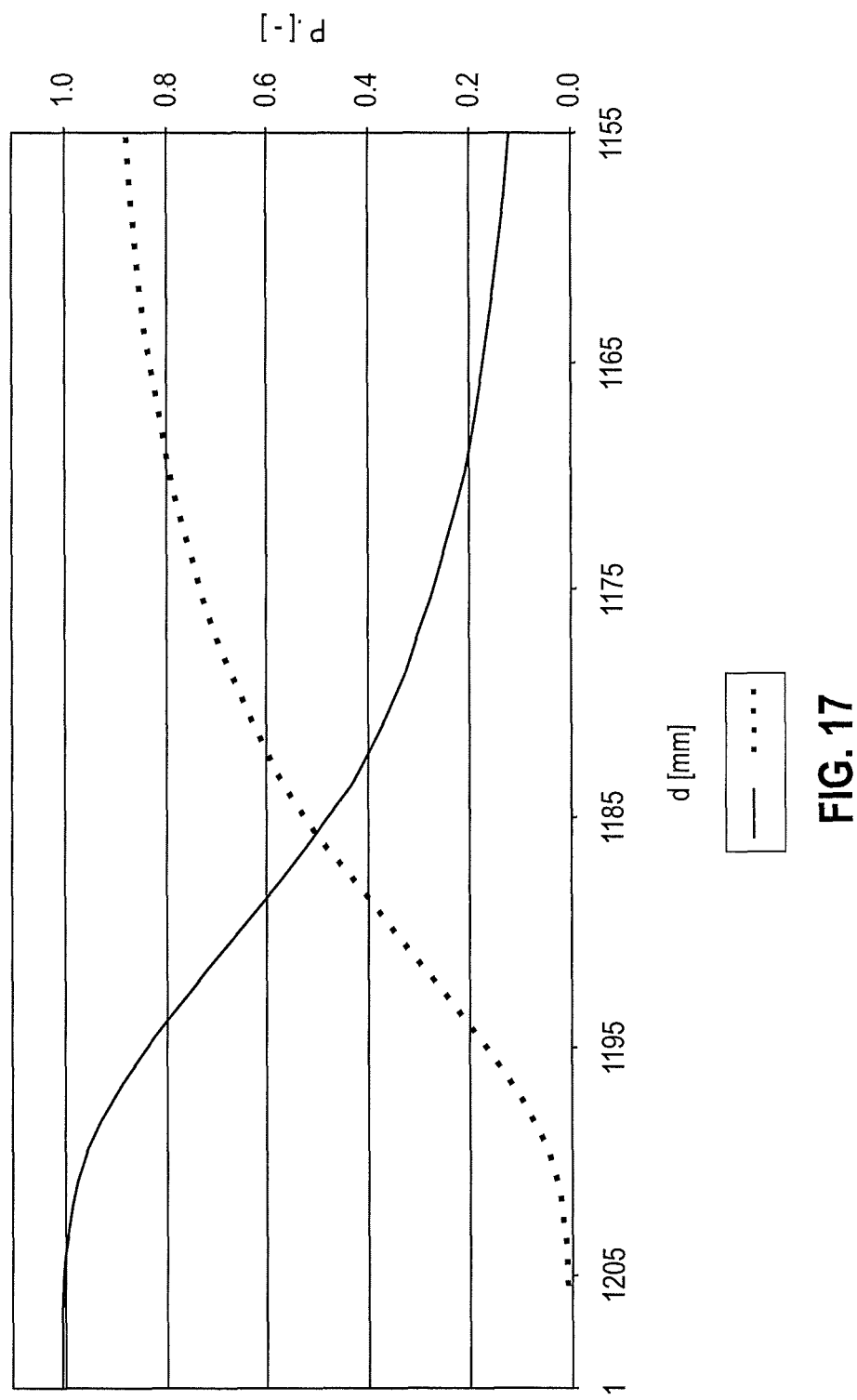
FIG. 17 is a graph showing the total irradiance captured by a thermal collector and a PV chip of a hybrid receiver, while displacing the hybrid receiver along the optical axis of the system.

FIG. 17 shows the total irradiance (normalized power) captured by the thermal collector (dotted curve) and the PV receiver (full line) while displacing the element along the optical axis (distance d (mm) in abscissa) towards the primary concentrator. Typically, ~30% of the solar radiation reaching the PVT receiver can be converted to electrical energy while the remaining 70% can be captured as heat, which together with the irradiance captured by the thermal collector contributes to a storage system. The design point of the system is preferably set to be between 90-20% of the load on the PVT receiver.

A number of conceptual variants can be contemplated. For instance, the thermal collector may have a conical shape. The thermal collector and the homogenizer could be one and a same element, provided with a suited shape to both collect solar radiation and distribute/concentrate reflected light as appropriate onto the PV receiver. When using a flat facetted mirror concentrator (as in FIG. 13), some of the facets could be fixed, others could be moved. Facets of the primary mirror can be tilted to redirect light on the periphery of the receiver 20, where the thermal receiver panel is placed.

Additional variants may include light cones mounted directly on the PV chips with cooling (high temperature) that eliminate inactive surfaces on 3JPV chip array. Such cones are arranged such as to redirect that light that would otherwise hit contact pads of the solar cells and the gap between them. Light is redirected to the photoactive area, thereby increasing the electrical efficiency of the system. A front electrode grid with reflective surfaces may prevent shading of sensitive PV surface. Antireflection surfaces using, e.g., moth eye patterns may be combined with front electrode grating that contributes to the wavelength filtering function by reflecting UV/blue light back to the homogenizer, to serve the more general functions of adsorption enhancement and filtering, as described earlier. Switchable absorbers, depending on humidity (large humidity and early morning/late evening may increase red shift and underload blue diode. Additional red absorbers may also be included.

The various features recited above, in respect of hybrid receivers, can be advantageously combined, in several manners. For example, exergetic recovery can be optimized by having a separate cooling loop 71 for the multichip receiver cooling 25 and for the homogenizer and shield cooling 72. As explained, electrical output can be controlled by moving the assembly along the optical axis closer to the mirror and away from the focal plane. Exergy optimization can further use a wavelength selective reflective filter to avoid exposure of the PV chips, e.g., a multichip module (or MCM) triple junction chips with light they cannot convert (UV, and far IR). The inactive area between the chips is advantageously reduced by having triangular reflectors placed on the front electrodes and the connection mesh (not shown for clarity).

Figure 18:
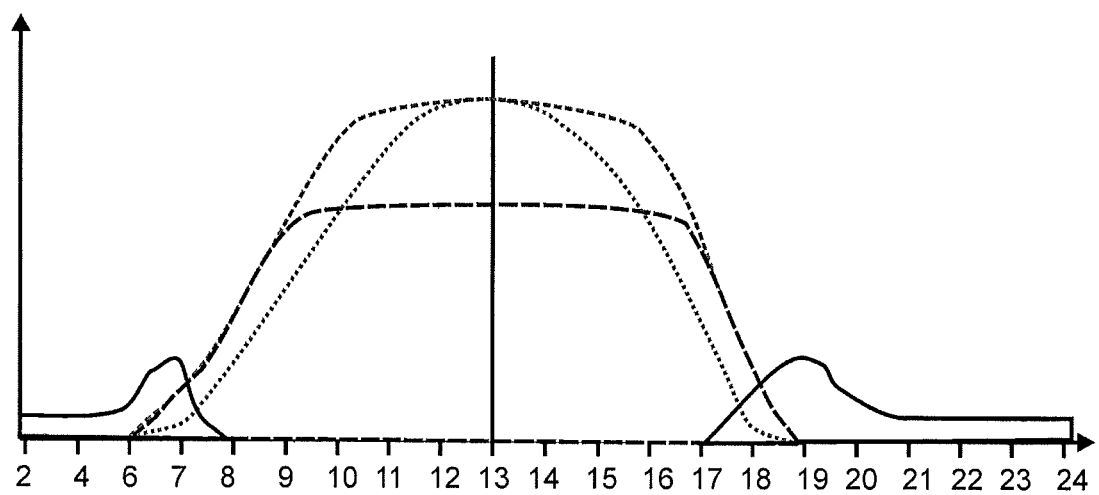
FIG. 18 is a graph comparing dispatched delivery of electrical power by various CPVT systems.

A dispatched delivery scenario of electrical power by a CPVT system as contemplated herein can for example be briefly described, in reference to FIG. 18. FIG. 18 shows three curves, representing:

Full line: the morning power demand peak and the evening demand peak;

Dotted (gauss-like curve): a typical PV 2 hour design power, having a maximum around 13:00;

Short-dashed: a typical CPV 6 hours design power; and

Dash: an 8-9 hour design power, as can be achieved thanks to embodiments of the invention. An 8-9 hour design power can indeed be achieved, i.e., output power can now be maintained over 8-9 hours instead of just 2 hours like for flat PV. In particular, the hybrid receiver can be moved out of the focal plane to reduce optical intensity, as explained earlier. A feedback loop can move the receiver back to the focal plane to compensate for temporary irradiation loss (e.g., light clouds) or to meet higher power output demand, as to be explained in more details in the next section. The excess energy is harvested as heat, thanks to the thermal collector and associated circuit and used to bridge the morning and evening peak demands, e.g., using a Rankin engine with stored hot (and pressurized) water (e.g., 150° C.). Depending on the actual size of the thermal collector, this temperature cannot be too large, otherwise this would lead to radiative losses from the large area thermal collector.

More details as to operation methods and system description shall be given in the next section.

Photovoltaic Thermal Hybrid Systems and Methods of Operation Thereof

The present section focuses on methods to operate photovoltaic thermal hybrid systems. An example of hybrid system 10 is shown in FIG. 10. Some components of or variants to this system are depicted in FIGS. 1-9, 12-15, and 19-20.

Figure 11:
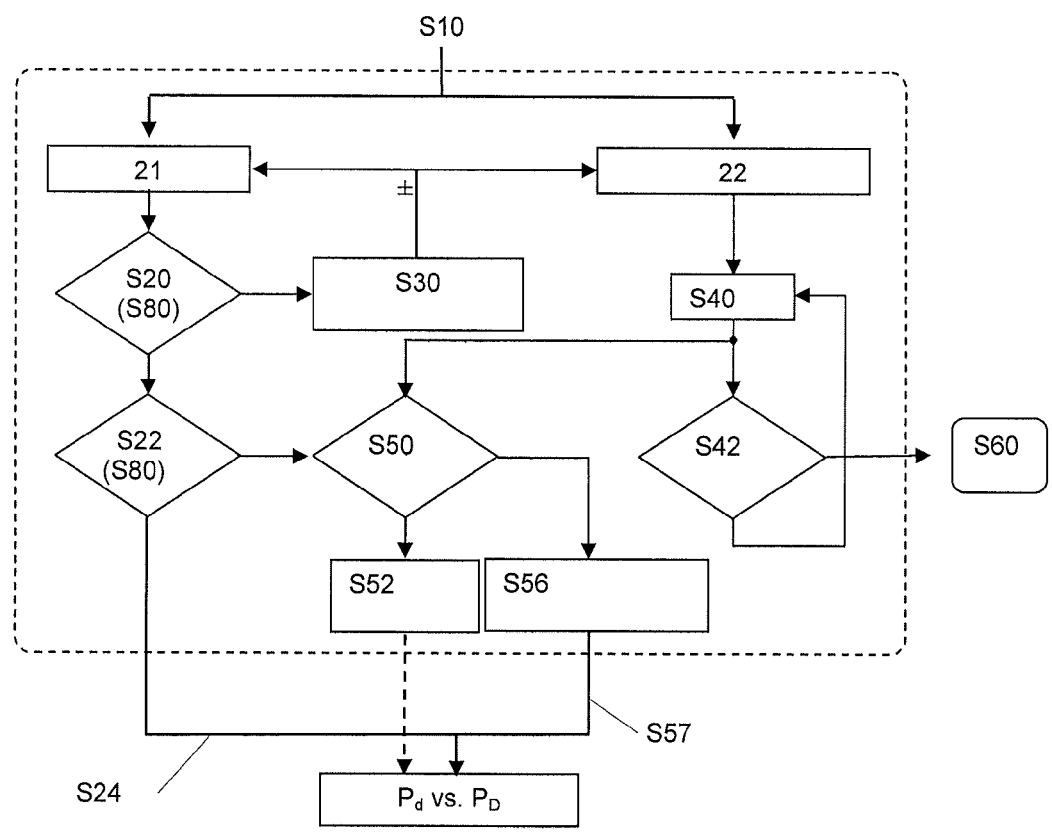
FIG. 11 is a flowchart of steps implemented in methods of operation of a photovoltaic thermal hybrid solar system such as depicted in FIG. 10.

Referring to FIGS. 1-20 in general and in particular to FIG. 11, the methods generally rely on a system 10 comprising: a hybrid solar receiver 20 such as described in section 2.2, i.e., wherein the receiver includes a photovoltaic module 21, operatively coupled to the system 10 to deliver an electrical output power $P_O$, e.g., for a power user; and a thermal collector 22 such as described in section 2.2 too. Importantly, for the purpose of implementing methods as described herein, the collector must be distinct (e.g., thermally insulated) from the photovoltaic module. In addition, the photovoltaic module and/or the thermal collector are/is movably mounted in the system (e.g., on a stage).

The system further includes a collector thermal storage 42. As discussed earlier too, the latter is thermally connected to the thermal collector 22, typically via a closed-loop heat circuit 72, such that heat collected at the thermal collector can be stored in the storage 42. In this application, two components "thermally connected" means the same as two components "thermally coupled", i.e., heat can be exchanged from one component to the other. Finally, system 10 includes positioning mechanism 30, which are adapted to move the photovoltaic module and/or the thermal collector.

Next, the operation methods include a step of instructing (FIG. 11, step S30) the positioning mechanism 30 to move the photovoltaic module 21 and/or the thermal collector 22 to change a radiation intensity ratio. The ratio compares intensity of radiation received (FIG. 11, step S10) at PV module 21 to intensity received (S10) at the collector 22. One understands that such methods can take advantage of devices such as described herein.

Whether to instruct the positioning mechanism 30 to move the photovoltaic module 21 and/or the thermal collector 22 is typically decided at a control system/unit 100 such as depicted in FIG. 20. This control system/unit shall be described in detail in the next section. Note that decision S30 can be based on a power demand as calculated, predicted, etc. but could also be based on thermal demand (at least partly). A power demand is the power needed from the grid at a particular time, e.g. noon peak or evening peak.

For instance, referring in particular to FIG. 11, data indicative of an electrical power demand $P_D$ may be received at a step S80. Decision S30 may then be carried out based on a comparison (steps S20, S22) of the PV output power $P_O$ (e.g., as delivered by the PV module) with the power demand.

Note that in typical applications, power demand is AC whereas the output power is DC. Thus, the system 10 shall typically include an inverter 28, see FIG. 10, through which power is processed before delivery to power user. In case, indirect comparison might be needed (AC to DC), depending on the system's logic 100. In general, $P_D$ is always AC power. Since a DC/AC conversion ratio or calibration curve is usually known, it can easily be integrated in the feedback loop. Conversion may change with loading (e.g., 98% at 100% load and 96% at 50% load) but an exact calibration curve is usually available.

In particular, decision S30 may be made to suitably move the PV module and/or collector to decrease the radiation intensity ratio if comparison S20 indicates that the output power $P_O$ is larger than the power demand $P_D$. Indeed, if $P_O$ is larger than $P_D$, it can be realized that leaving the configuration of the PV module vs. collector unchanged is sub-optimal. On the contrary, with a receiver 20 such as described above, the configuration of the receiver 20 can be altered to favor thermal collection instead of electrical power conversion.

Now, it can be instructed (step S24) to deliver the output power $P_O$ generated by the PV module 21 to a power user, to meet the power demand $P_D$ if $P_O$ matches the power demand $P_D$, based on the comparison carried out at steps S20, S22. In FIG. 11, $P_d$ denotes the actually dispatched power (step S24, S57 or S52). Complete description of FIG. 11 shall be given later.

Typically, such comparisons S20, S22 are subject to a tolerance, which depends on the system capacity, reactivity, etc. This tolerance can be adjusted empirically, e.g., based on trial-and-error process. Also, here again, consistent power values are compared (e.g., AC to AC).

Figure 14:
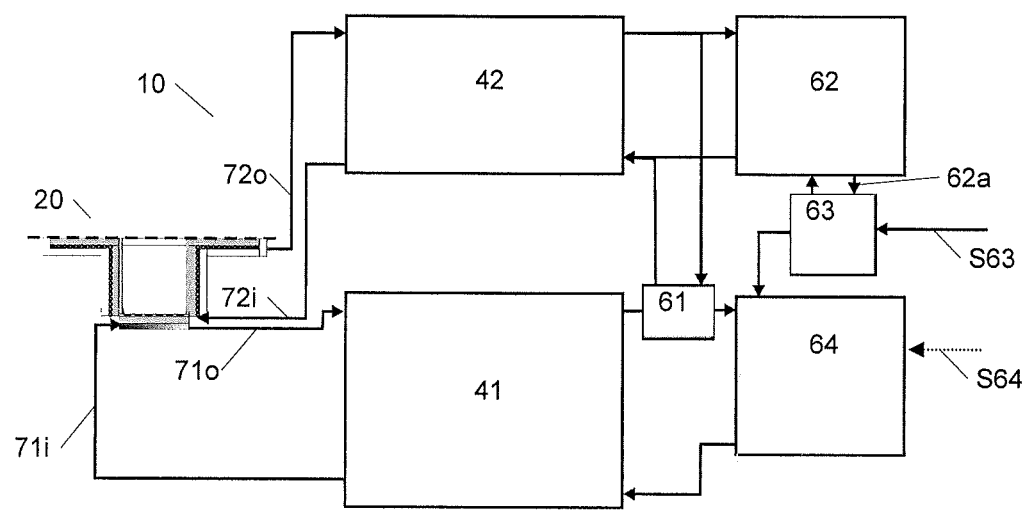
FIGS. 14-15 are block diagram representations of additional photovoltaic thermal hybrid solar devices-based systems.
Figure 15:
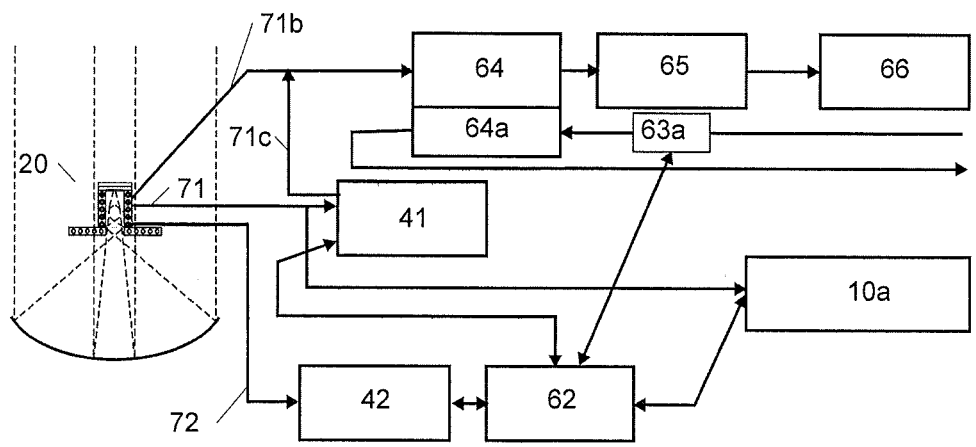

Additional components may be provided in the system 10 to further optimize it. For instance, system 10 may further include a heat engine 62, as depicted in FIGS. 14-15. The heat engine 62 is thermally connected to the collector thermal storage 42.

In that case, present methods may further include steps of instructing (FIG. 11, steps S50, S56) the heat engine 62 to start a process of thermal-to-electrical conversion, to convert heat stored in the collector thermal storage 42. Whether to do so is typically decided based on comparisons S20, S22, i.e., if it turns out that $P_O$ is lower than the power demand $P_D$.

Note that the heat engine 62 can be any kind of thermal-to-electrical converter suited for the present purposes, e.g., to run a Rankine cycle, preferably an organic Rankine cycle (ORC), which uses an organic fluid such as n-pentane or toluene in place of water and steam. This allows for using lower-temperature heat sources, which typically operate at around 70-90° C., but works still better at higher temperatures such as 120-150° C. as presently contemplated. Suitable fluids can be chosen among Hydrochlorofluorocarbons (HCFC), Chlorofluorocarbons (CFC), Perfluorocarbons (PFC), Siloxanes, Alcohols, Aldehydes, Ethers, Hydrofluoroethers (HFE), Amines, Fluids mixtures (zeotropic and azeotropic), Inorganic fluids. Examples are: R245fa, R123, n-butane, n-pentane and R1234yf, Solkatherm, R134a, R600, carbon dioxide, R152a, R600a, R290, etc. A comparison of the critical temperatures of the fluids vs. optimal operation conditions of systems as contemplated herein allows for refining the choice. In particular, experiments conducted in the context of the present invention have shown that fluids R134a, followed by R152a, R600, R600a and R290 are most suitable fluids for low-temperature applications driven by heat source temperature below 90° C. In variants, a thermoelectric generator is relied upon, which converts heat to electrical power without working fluid and moving parts. Yet, thermoelectric generators currently have lower conversion efficiency for kW to MW sized converters.

A control system (FIG. 20, ref. 100) with feedback loop is used to adapt the electrical power output to the actual demand required, e.g., by a grid control station. FIG. 11 shows an example of a main control process for a dispachable power mode. In this example, the generated electrical power is the main control variable and is adapted to the demand using the receiver positioning system. The positioning response is in the range of seconds, while the start of a Rankine cycle can be predicted and therefore kept with the same response time.

Even more valuable than dispatched power is the function of grid services. A photovoltaic unit with motorized receivers can take this function when a feedback loop is closed between the phase angle $\Phi$ in the grid (indicating the load situation) and the position of the receiver.

The smaller the angle $\Phi$ the more is the receiver moved away from the focus; the larger the angle $\Phi$ the closer the receiver is moved to the receiver. Most valuable are grid services that can react very fast i.e. within seconds, a thing that can be achieved thanks to embodiments of the present invention.

In this respect, an inverter can switch off an input current in a matter of milliseconds, e.g., in a situation where the grid fails (lightning or physical damage). In this situation the receivers 20 can be moved to the minimum power position within a few seconds; power can thus be dissipated in open circuit voltage mode. The generated charges flow back in the PV diodes, adding thermal load to the microchannel cooler. Accordingly, no damage to the system is induced.

Next, additional optimization to the system 10 can be achieved if the methods and systems integrate additional client processes. For instance, the method may further include steps of instructing (FIG. 11, step S42, S60) to trigger additional processes to dissipate heat from the collector thermal storage. This is preferably decided at step S42, if a heat storage threshold of the collector thermal storage 42 is achieved.

The additional processes are preferably a desalination process and/or an adsorption cooling process. More generally, a variety of client processes can be integrated, e.g., a free cooling process or a process to deliver heat for a chemical application and/or process, etc. However, it can be realized that combining present systems/methods with a desalination process or an adsorption (e.g., water adsorption) cooling process has more value in context such as contemplated in present embodiments, i.e., the higher the solar radiation levels, the more valued is the output of a desalination or a cooling process.

Moreover, as depicted in FIG. 10, the system 10 may further include a first heat circuit 71 (typically closed-loop), connecting the PV module to a PV thermal storage 41, wherein the latter is distinct from the collector thermal storage 42. The PV thermal storage 41 and circuit 71 are used to cool the PV module (use can for instance be made of a cooling device 25 such as described in section 2.1). A second heat circuit 72 (typically closed-loop too) is also provided, distinct from the first heat circuit 71, which connects the collector thermal storage 42 to the thermal collector 22. Components 41, 42 also appear in FIGS. 14 and 15.

Note that in variants, the system may include a heat circuit connecting both the PV module and the thermal collector to a thermal storage, in series, such that fluid in a single heat circuit first reaches the photovoltaic module to cool it down and then reaches the thermal collector.

Any of the heat circuits contemplated herein (a single heat circuit when using only one circuit or one of or both the two circuits when using distinct heat circuits) could additionally be used to cool any component in the system. Accordingly, part or all of the components that dissipate heat can be included in the loop, such as to contribute to the energy conversion efficiency of the system.

Next, the system may further include a heat exchanger 61, as shown in FIG. 14. The exchanger 61 is thermally connected to the PV storage 41. Accordingly, it can be instructed to provide heat stored in PV storage 41 to a thermal user 64, via the heat exchanger 61.

Advantageously, heat exchanger 61 is further thermally connected to the collector thermal storage 42. In that case, it can be instructed to provide additional heat stored in the thermal collector storage 42 to the heat exchanger 61, while providing heat stored in the PV storage 41 to the thermal user 64, via exchanger 61.

Heat exchanger 61 may actually include two heat exchangers in series: a first one lifts up temperature and a second one transfers heat to the user. The second heat exchanger can be an integral part of the thermal user 64.

As illustrated in FIG. 14, the system 10 may further include an additional heat exchanger 63, thermally connected to heat engine 62 and thermal user 64. Advantageously, a thermal user 64 (desalination, adsorption heat pump) is furthermore thermally connected to the PV thermal storage 41. It can furthermore be connected to collector thermal storage 42, via heat exchanger 61. Then the method may additionally include a step of instructing (FIG. 11, S60) the heat engine to start a process of thermal-to-electrical conversion of heat stored in the collector thermal storage 42, using heat exchanger 63 as a low temperature pool.

The additional heat exchanger 63 may be connected to the heat engine 62 and the thermal user 64 to provide the low temperature pool for the Rankine cycle. For example: a saline feed can be directly inputted to user 64 (step S64, FIG. 14), in which case the Rankine cycle may use air as a low temperature pool; or the saline feed may pass through heat exchanger 63 (preferred option, step S63, FIG. 14) and thus serves as the low temperature pool to increase a difference of temperature for the Rankine cycle.

At present, a complete description of the method of FIG. 11 is given. FIG. 11 corresponds to a particular embodiment, combining many aspects of the methods discussed above:

Step S10: solar radiation is received on the thermal collector and/or the PV module;

Step S10: the actual $P_O$ is compared to the power demand $P_D$, thanks to data relating to the a power demand as received at step S80 (e.g., power demand may vary rapidly; a corresponding data flow may be received and processed at unit 100, FIG. 20). In particular, if it appears that $P_O > P_D$, the process goes to S30. As stated, this comparison is preferably subject to ad-hoc tolerance and possibly a timer, to avoid too frequent actuations. If this condition is not fulfilled ($P_O$ is not larger than $P_D$), the process goes to S22;

Step S30: as $P_O > P_D$, positioning mechanism are instructed to move the photovoltaic module and/or the thermal collector, to decrease the radiation intensity ratio and thereby favor radiation collected at the thermal collector;

Step S22: unit 100 tests whether $P_O \approx P_D$, in which case $P_O$ can be dispatched, step S24, to meet the current power demand ($P_O = P_d$). If not, the process goes to S50;

Step S50: unit 100 checks whether heat stored in storage 42 is sufficient to start a thermal-to-electrical conversion and thereby meet the power demand $P_D$;

Step S56: if yes, the thermal-to-electrical conversion process is started; electrical power accordingly produced can then be dispatched, step S57, to meet the current power demand. If necessary, the electrical power obtained by thermal-to-electrical conversion may be "added" to the PV power available $P_O$ to meet the demand. Yet, the "size" of the thermoelectrical converter shall typically be 10-20% of the maximal power that the CPVT system can deliver. This, in practice, is enough to satisfy demand overnight but not during day.

Step S52: If not (i.e., if the heat stored in storage 42 is not sufficient to start a thermal-to-electrical conversion), then the process shall fail to meet the demand. Yet, the available PV power can nonetheless be delivered;

Step S40: since at step S30, positioning mechanism may have moved the photovoltaic module and/or the thermal collector to favor radiation collected at the thermal collector, heat can conveniently be stored (step S40). The current level of heat as stored at S40 is used as input for S50;

Step S42: on the other hand, if the storage capacity appears to be achieved (as monitored at S42), unit 100 may instruct to start an additional, client process (e.g., free cooling, desalination, adsorption cooling, etc.): the process goes to S60. Now, if the storage capacity is not achieved yet, additional heat can be stored, step S40.

Following this principle, a particular efficient scenario is now described, referring notably to FIG. 14. Heat is collected from the microchannel cooler (FIG. 1-5, ref. 25) into a low grade heat tank 41 (FIG. 14), by way of heat circuit 71 (71i, 71o). Heat is further collected from the homogenizer 74 (FIG. 9) and thermal collector 22 (FIG. 9) into a high-grade heat tank 42 (FIG. 14), thanks to circuit 72 (72i, 72o). The low grade heat tank directly feeds power user, namely a desalination system (membrane distillation) 64. Additional heat exchanger 61 can lift the temperature using heat from the high grade tank when the low-grade heat tank is partially or fully depleted. The high grade heat tank feeds a Rankine process 62 to convert heat into electrical power with an efficiency of 20-30%. The low temperature pool is derived from the incoming salt water S63 or from an air cooler S64 (FIG. 14).

FIG. 15 shows another possible configuration for the system 10, whose underlying scheme allows for managing both electrical power and water delivery on demand. FIG. 15 shows:

The same components 20, 41, 42, 62 and 64 as in FIG. 14, except that the desalination system includes 64, 64a and 65. Reference 64 now corresponds to the desalination process, 64a is the corresponding feed of the process 64, and 65 refers to a desalination water storage. The desalination water storage 65 is connected to the desalination process 64 to provide water 66 on demand;

A heat exchanger 63a, which is connected to feed 64a of the desalination system and to the Rankine process 62, itself connected to both storages 41 and 42 as before. Note that heat exchanger 63a in FIG. 15 plays a similar role as heat exchanger 63 in FIG. 14;

The first heat circuit 71 connects to the first storage 41 as before. The circuit now branches to the desalination process 64 (via circuit portion 71b), which is otherwise aided by the storage 41 (via circuit portion 71c). Circuit portion 71c may include a heat exchanger, if needed.

The above system allows for providing both electrical power 10a and water delivery 66 on demand, making optimal use of high and low grade heat tanks.

Methods as described hereinbefore are all the more efficient if the temperature in the collector thermal storage 42 is substantially larger than the temperature in the PV thermal storage 41, i.e., more than 20° C. However, a temperature difference of more than 30° C. substantially improve performances of the systems. Ideally, temperatures differ by more than 50° C., a thing that can be achieved in embodiments as described herein.

The hybrid receiver 20 is preferably movably mounted in the system 10, such that positioning mechanism 30 can move the receiver 20 as a whole (e.g., the photovoltaic module and the thermal collector are not movable independently from each other by the positioning mechanism), by simple translation along the optical axis, as described in section 2.2. This substantially simplifies the design of the system. In addition, this allows for integrated solutions that efficiently capture heat dissipated by the various components of the receiver 20, e.g., via circuit 72. In turn, the temperature difference between the two circuits 71, 72 can be optimized.

In variants, only the thermal collector panel 22a could be moved (the PV module 21 is fixed). For instance: the thermal collector panel may consists of essentially a 2D arrangement of thermal circuits intermingled with an array of lenses, which collector can be moved more or less close to the fixed PV module. In addition, assuming a homogenous distribution of the radiation on the photovoltaic receiver, this latter can be moved relatively to the thermal receiver (or vice versa), in transverse direction to incoming radiation, to cover a section of the photovoltaic receiver and accordingly vary the energy captured in the thermal circuit vs. the PV circuit. Accordingly, there are various possible ways of embodying a photovoltaic module and/or a thermal collector movably mounted in the system.

Weather Predictions, Predicted Electricity and Water on Demand

The objective of some of the methods described herein is to provide electricity on demand and at the same time fulfill other core demands in a sunny location based on medium/high grade heat delivered by the solar CPVT receiver: e.g., desalinated water and cooling. Desalination and/or cooling can be operated directly or from stored heat. A sufficient temperature level for desalination and cooling can be reached thanks to the above methods. Hot water can be stored during high irradiance, i.e., exceeding the need for electricity. The coolant from the PV cooling unit is stored in the warm water tank 41 for later use at power users 64 (desalination and cooling). When more electrical energy is needed than available from the PV receiver, a low-pressure organic Rankine process 62 is activated. A microchannel heat exchanger 25 driven by the stored heat creates vapor that drives a turbine and produces electrical power.

Electrical demand curves in most locations show a peak during noon and two smaller peaks in the morning and in the evening. The demand during the night is typically 10 times smaller. With an organic Rankine facility that is 10 times smaller than the peak photovoltaic output the night time demand, and together with the partial solar power the morning and evening peaks can be covered.

In order to bridge the night about 30% of the daily thermal input is collected at a high temperature level and converted to electrical power by a high efficiency low temperature organic Rankine cycle. Heat is stored in a hot water tank during day, together with the lower ambient temperature at night the Rankine cycle can convert the heat into electrical power with a fairly good efficiency. The efficiency of the thermal-electrical conversion will be improved by use of the solar concentrators to radiate thermal energy to space at low or negative Centigrade temperatures. Since thermal desalination provides a relative value that is more than 30% of the electrical output, it can be realized that it is the ideal candidate for a controlled output power station. Thermal desalination processes can be easily regulated by a factor of four and delivery of desalinated water can be on-demand when a large output water storage tank is used.

To allow a concentrated photovoltaic thermal system to store a week worth of energy for desalination and electrical energy generation at reasonable prices two separate storage tanks are needed: (i) a ~5000 $m^3$ per MW warm water atmospheric pressure storage pool and a ~1000 $m^3$ pressurized hot water storage tank. The warm water pool stores the 90° C. heated coolant from the PV microchannel coolers whereas the hot water tank stores the 150° C. coolant from the thermal collector (panel+homogenizer). In variants, a single low pressure tank with a volume of ~5000 $m^3$ is needed for a sequential cooling system (circuits 71 and 72 in series) that operates at ~120° C. and 2 bars. The hot water storage can be used to drive a low-pressure organic Rankine engine whereas the warm water storage tank is used to drive the membrane desalination or adsorption cooling processes (FIG. 14). A heat exchanger is devised to extend the capacity of the warm water tank and the desalination capacity by a factor of two in case electrical demand is low. Both tanks use a layered storage approach to prevent temperature drops in partially filled tanks.

More problematic are periods of bad (rainy) weather where the direct solar radiation is very small. Fortunately, the demand for desalinated water or cooling during these periods is negligible. This means the whole thermal storage can be converted to electricity using the organic Rankine facility. With improved computer modeling weather prediction has become accurate over a period of five days, i.e., a period for which thermal storage can be achieved.

The efficiency of the thermal-electrical conversion will be improved by use of solar concentrators to radiate thermal energy to space at low or negative Centigrade temperature.

Referring to FIGS. 19 and 20: for areas with multiple solar power stations the stations that face the wind direction can serve as radiation predictors for the subsequent power stations. This allows a more accurate short term dispatching of the electrical power. For situations with upcoming larger clouds the desalination production is reduced in favor of thermal storage to have enough capacity for Rankine power generation. The control facility 100 to perform such functions can be automated. Movement speed and direction of clouds can be measured by detecting the covering speed and direction on the different receivers for an upcoming cloud. The measurement is performed by e.g., the quadrant detector that is already part of the two axis trackers. Such inputs are then fed into the control system 100 to determine the trajectory of the cloud and determine whether and when a neighboring power station will be affected. This monitoring can be performed continuously. Outside of the main production zone 300 scattered "metrology" receiver arrays 301-303 are placed that may supply single houses or small villages but mainly serve as "early warning" stations for the appropriate dispatching strategy of the main power stations. These arrays have to be large enough to be able to detect cloud speed and direction.

Next, the control system 100 can be designed to tune the buffered energy corresponding to weather predictions. The capability planning of the power-station is now coupled with weather forecast. Before a predicted rainfall, desalination can be reduced to accumulate heat for production of electricity, in order to bridge the absence of direct solar radiation during the rainfall period. This is easily compensated due to the lower demand for water during rainy periods. Accumulation of heat and expansion of thermal storage is accomplished by running the coolant hotter through the CPVT to sacrifice electrical yield.

Specific Implementation Details

Many optional features can be contemplated, some of which have already been evoked above. To start with, the thermal collector 22 and PV module 21 may be embodied such as described in section 2.2. Similarly, the receiver may further include mirror elements 74, such as depicted in FIGS. 6-7. The latter are provided in an intermediate section 75 (FIG. 9) and preferably thermally connected to the collector thermal storage 42, by a same circuit 72 that connects the thermal collector 22 to the collector thermal storage 42. The receiver may also include: a band pass filter 76 as described in section 2.2; a concentrator (FIG. 10, 27, 27a, 27b, 271) having any of the features described in section 2.2.

Concerning operation methods: the feedback algorithm could also be based on thermal demand, to produce water, refrigeration or feed another thermal process, and not only on the power demand. In addition, a Rankine engine can run forward and backward, to help to "pump" up the stored heat. Reversible Rankine engine can contribute to grid services, which allows for using the investment in the Rankine engine longer and with better value.

Additional Technical Implementation Details

Finally, FIG. 20 illustrates an exemplary embodiment of a computerized unit suitable for implementing aspects of the present invention. It will be appreciated that the methods described herein are largely non-interactive and automated. In exemplary embodiments, the methods described herein can be implemented either in an interactive, partly-interactive or non-interactive system. The methods described above can be partly implemented in software (e.g., firmware), hardware, or a combination thereof. In exemplary embodiments, the methods described herein are implemented in software, as an executable program, and is executed by a special or general-purpose digital computer, such as a personal computer, workstation, minicomputer, or mainframe computer. The system 100 therefore includes general-purpose computer 101.

In exemplary embodiments, in terms of hardware architecture, as shown in FIG. 20, the computer 101 includes a processor 105, memory 110 coupled to a memory controller 115, and one or more input and/or output (I/O) devices 140, 145 (or peripherals) that are communicatively coupled via a local input/output controller 135. The input/output controller 135 can be, but is not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components. As described herein the I/O devices 140, 145 can be any generalized cryptographic card or smart card known in the art.

The processor 105 is a hardware device for executing software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing software instructions.

The memory 110 can include any one or combination of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another, but can be accessed by the processor 105.

The software in memory 110 may include one or more separate programs, each of which includes an ordered listing of executable instructions for implementing logical functions. In the example of FIG. 20, the software in the memory 110 includes methods described herein in accordance with exemplary embodiments and a suitable operating system (OS) 111. The OS 111 essentially controls the execution of other computer programs, such as the methods as described herein, and provides scheduling, input-output control, file and data management, memory management, and communication control and related services.

The methods described herein may be in the form of a source program, executable program (object code), script, or any other entity comprising a set of instructions to be performed. When in a source program form, then the program needs to be translated via a compiler, assembler, interpreter, or the like, which may or may not be included within the memory 110, so as to operate properly in connection with the OS 111. Furthermore, the methods can be written as an object oriented programming language, which has classes of data and methods, or a procedure programming language, which has routines, subroutines, and/or functions.

In exemplary embodiments, a conventional keyboard 150 and mouse 155 can be coupled to the input/output controller 135. Other output devices such as the I/O devices 140, 145 may include input devices, for example but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. As described herein the I/O devices 140, 145 can be any generalized cryptographic card or smart card known in the art. The system 100 can further include a display controller 125 coupled to a display 130. In exemplary embodiments, the system 100 can further include a network interface 160 for coupling to a network 165. The network 165 can be an IP-based network for communication between the computer 101 and external servers or clients and the like via a broadband connection. The network 165 transmits and receives data between the computer 101 and external systems 300, 301, 302, 303. In exemplary embodiments, network 165 can be a managed IP network administered by a service provider. The network 165 may be implemented in a wireless fashion, e.g., using wireless protocols and technologies, such as WiFi, WiMax, etc. The network 165 can also be a packet-switched network such as a local area network, wide area network, Internet network, or other type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a PC, workstation, intelligent device or the like, the software in the memory 110 may further include a basic input output system (BIOS) (omitted for simplicity). The BIOS is stored in ROM so that the BIOS can be executed when the computer 101 is activated.

When the computer 101 is in operation, the processor 105 is configured to execute software stored within the memory 110, to communicate data to and from the memory 110, and to generally control operations of the computer 101 pursuant to the software. The methods described herein and the OS 111, in whole or in part are read by the processor 105, perhaps buffered within the processor 105, and then executed.

When aspects of the systems and methods described herein are implemented in software, as is shown in FIG. 11, the methods can be stored on any computer readable medium, such as storage 120, for use by or in connection with any computer related system or method.

As will be appreciated by one skilled in the art, aspects of the present invention may be embodied as a system, method or computer program product. Accordingly, the aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, implement the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart/block diagrams in FIGS. 11, 14 and 15 illustrate the architecture, functionality, and operation of possible implementations of systems, involving methods and computer program products according to embodiments. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiment disclosed, but that the present invention will include all embodiments falling within the scope of the appended claims. For example: various other manifold layer designs/dimensions/materials could be relied upon for the cooling devices; various other shapes/dimensions can be contemplated for the thermal panels of the thermal collectors;

Additional components (beyond components mentioned in the present specification) may be inserted in the systems of FIGS. 10, 14 and 15. Many usual components have been omitted in the description of the devices and systems of FIGS. 1-10, 12-15, and 19-20, for the sake of conciseness.

The invention claimed is:

1. A method of operating a photovoltaic thermal hybrid system having a hybrid solar receiver with a photovoltaic module, operatively coupled to the system to deliver an electrical output power for a power user, a thermal collector distinct from the photovoltaic module, wherein the photovoltaic module and/or the thermal collector are movably mounted in the system, a collector thermal storage thermally connected to the thermal collector to store heat collected at the thermal collector, a heat engine, thermally connected to the collector thermal storage, and a positioning mechanism adapted to move the photovoltaic module and/or the thermal collector, the method comprising:
   receiving data indicative of an electrical power demand;
   repeatedly comparing the electrical power demand with the electrical output power;
   moving, using the positioning mechanism, to move the photovoltaic module and/or the thermal collector to decrease a ratio of an intensity of radiation received at the photovoltaic module to an intensity of radiation received at the thermal collector, when the electrical output power is larger greater than the electrical power demand; and
   delivering the electrical output power generated by the photovoltaic module to the power user to meet the electrical power demand when the electrical output power matches the electrical power demand.

2. The method of claim 1 further comprising:
   starting, at the heat engine, a process of thermal-to-electrical conversion of heat stored in the collector thermal storage when the electrical output power generated by the photovoltaic device is less than the electrical power demand.

3. The method of claim 1, further comprising:
   triggering a desalination process and/or an adsorption cooling process in order to dissipate heat from the collector thermal storage.

4. The method of claim 1, further comprising:
   cooling the photovoltaic module using a first heat circuit, wherein the first heat circuit thermally connects the photovoltaic module to a photovoltaic thermal storage and the first heat circuit thermally connects to the collector thermal storage; and
   connecting the collector thermal storage to the thermal collector using a second heat circuit.

5. The method of claim 4, further comprising:
   providing heat stored in the photovoltaic thermal storage to a thermal user via a first heat exchanger, thermally connected to the photovoltaic thermal storage.

6. The method of claim 5, further comprising:
   providing additional heat stored in the collector thermal storage to the first heat exchanger while providing heat stored in the photovoltaic thermal storage to the thermal user via the first heat exchanger.

7. The method of claim 5, further comprising:
   providing a second heat exchanger thermally connected to the heat engine and a given thermal user, the given thermal user being further thermally connected to the photovoltaic thermal storage or to both the photovoltaic thermal storage and the collector thermal storage, via the second heat exchanger; and
   starting, at the heat engine, a process of thermal-to-electrical conversion of heat stored in the collector thermal storage using the given thermal user as a low temperature pool.

8. The method of claim 1, wherein a temperature in the collector thermal storage is higher than a temperature in the photovoltaic thermal storage by at least 30° C.

9. The method of claim 1, wherein a temperature in the collector thermal storage is higher than a temperature in the photovoltaic thermal storage by at least 50° C.

10. The method of claim 1, further comprising:
    mounting a photovoltaic thermal hybrid solar receiver in the photovoltaic thermal hybrid system such that the positioning mechanism is configured to move the photovoltaic thermal hybrid solar receiver as a whole.

11. The method of claim 1, wherein:
    extending the thermal collector in a first plane, wherein the thermal collector comprises an aperture; and
    extending a photo-active area within an area of the photovoltaic module in a second plane, at a distance of the aperture, the photo-active area being vis-à-vis the aperture, a projection of the aperture perpendicularly to the second plane essentially corresponding to the photo-active area,
    wherein the thermal collector further comprises one or more of:
    one or more mirror elements provided in an intermediate section between the first plane and the second plane, the mirror elements thermally connected to the collector thermal storage, by a same heat circuit that connects the thermal collector to the collector thermal storage; and
    a band pass filter arranged at the level of the aperture.

12. The method of claim 1, further comprising:
    concentrating radiation towards an optical focus of a concentrator; and
    moving the photovoltaic module in or out of the optical focus using the positioning mechanism.

* * * * *